(12) United States Patent
Choi et al.

(10) Patent No.: US 12,193,276 B2
(45) Date of Patent: Jan. 7, 2025

(54) ELECTRONIC DEVICE

(71) Applicant: SAMSUNG DISPLAY CO., LTD., Yongin-si (KR)

(72) Inventors: Minsoo Choi, Hwaseong-si (KR); Seokgyu Yoon, Hwaseong-si (KR); Byeongwook Yoo, Hwaseong-si (KR); Changwoong Chu, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 399 days.

(21) Appl. No.: 17/652,771

(22) Filed: Feb. 28, 2022

(65) Prior Publication Data
US 2022/0359628 A1  Nov. 10, 2022

(30) Foreign Application Priority Data

May 7, 2021  (KR) ........................ 10-2021-0058996

(51) Int. Cl.
*H01L 51/50* (2006.01)
*H10K 50/11* (2023.01)
(Continued)

(52) U.S. Cl.
CPC ........... *H10K 59/122* (2023.02); *H10K 50/11* (2023.02); *H10K 50/15* (2023.02); *H10K 50/16* (2023.02);
(Continued)

(58) Field of Classification Search
CPC ..... H10K 59/122; H10K 50/11; H10K 85/211
See application file for complete search history.

(56) References Cited

U.S. PATENT DOCUMENTS 9,666,817 B2  5/2017 Kim et al.
9,960,353 B2  5/2018 Liang et al.
(Continued)

FOREIGN PATENT DOCUMENTS

EP  4 047 681  8/2022
KR  10-1661397  10/2016
(Continued)

OTHER PUBLICATIONS

"Seong Bin Lim et al., Journal of the Korean Physical Society 69. 421-425 (2016), Reduction of the Dark Current in a P3HT-Based Organic Photodiode with a Ytterbium-Fluoride Buffer Layer for Electron Transport".
(Continued)

*Primary Examiner* — Anthony Ho
(74) *Attorney, Agent, or Firm* — F. CHAU & ASSOCIATES, LLC

(57) ABSTRACT

An electronic device includes a base layer and a display element layer including a pixel definition layer having an opening defined therethrough, a light emitting element, and a light receiving element. Each of the light emitting element and the light receiving element includes a first electrode, a hole transport region disposed on the first electrode, an electron transport region disposed on the hole transport region, and a second electrode disposed on the electron transport region. The light emitting element includes a light emitting layer disposed between the hole transport region and the electron transport region. The light receiving element includes a light receiving layer disposed between the hole transport region and the electron transport region and an electron extraction layer, including an n-dopant material, disposed between the light receiving layer and the electron transport region. The light receiving element converts a light incident thereto into an electrical signal.

25 Claims, 10 Drawing Sheets

(51) Int. Cl.
  *H10K 50/15* (2023.01)
  *H10K 50/16* (2023.01)
  *H10K 59/122* (2023.01)
  *H10K 59/35* (2023.01)
  *H10K 85/20* (2023.01)
  *H10K 101/40* (2023.01)

(52) U.S. Cl.
  CPC ........... *H10K 59/35* (2023.02); *H10K 85/211* (2023.02); *H10K 2101/40* (2023.02)

(56) References Cited

U.S. PATENT DOCUMENTS

| | | |
|---|---|---|
| 2010/0012189 A1 | 1/2010 | Sakai et al. |
| 2013/0075761 A1 | 3/2013 | Akiyama |
| 2020/0212138 A1 | 7/2020 | Lee et al. |

FOREIGN PATENT DOCUMENTS

| | | |
|---|---|---|
| KR | 10-2017-0014797 | 2/2017 |
| KR | 10-2020-0030880 | 3/2020 |

OTHER PUBLICATIONS

Taisuke Kamada et al., J Soc Inf Display vol. 27, Issue6 Jun. 2019, pp. 361-371, OLED display incorporating organic photodiodes for fingerprint imaging.
Seong Bin Lim et al., J. Mater, Chem. C, 2016,4, 4920-4926, Reduced leakage current and improved performance of an organic photodetector using an ytterbium cathode interlayer (1).
Extended European Search Report Dated Oct. 6, 2022 For Application Serial No. 22172059.5.

ELECTRONIC DEVICE

CROSS-REFERENCE TO RELATED APPLICATION

This U.S. non-provisional patent application claims priority under 35 U.S.C. § 119 to Korean Patent Application No. 10-2021-0058996, filed in the Korean Patent Office on May 7, 2021, the contents of which are hereby incorporated by reference in their entirety.

TECHNICAL FIELD

The present disclosure relates to an electronic device and, more particularly, to an electronic device including a light emitting element and a light receiving element in an active area thereof.

DISCUSSION OF THE RELATED ART

Various electronic devices incorporate a display so as to provide image information to a user. Often, these displays are touch-sensitive so as to sense an external input provided by a user such as by a press of the user's finger or the application of a stylus.

Approaches for recognizing external inputs include a capacitive method that senses a variation in capacitance formed between electrodes, an optical method that senses an incident light using an optical sensor, and an ultrasonic method that senses a vibration caused by the touch using a piezoelectric material. Where the optical sensor is used, sensitivity of the light receiving element may be increased by efficiently converting the received light into an electrical signal.

SUMMARY

An electronic device includes a base layer and a display element layer disposed on the base layer. The display element layer includes a pixel definition layer provided with an opening defined therethrough, a light emitting element, and a light receiving element distinguished from the light emitting element by the pixel definition layer. Each of the light emitting element and the light receiving element includes a first electrode, a hole transport region disposed on the first electrode, an electron transport region disposed on the hole transport region, and a second electrode disposed on the electron transport region. The light emitting element includes a light emitting layer disposed between the hole transport region and the electron transport region, and the light receiving element includes a light receiving layer disposed between the hole transport region and the electron transport region to convert light incident thereto into an electrical signal and an electron extraction layer disposed between the light receiving layer and the electron transport region and including an n-dopant material.

The n-dopant material may include a metal having a work function equal to or smaller than about 3.0 eV.

The n-dopant material may include an organic compound having a highest energy occupied molecular orbital (HOMO) level equal to or greater than about −3.0 eV.

The n-dopant material may include Ca, Yb, K, Cs, Rb, and/or Li.

The light emitting element might not include the electron extraction layer.

The electron transport region may include an electron transport layer and an electron injection layer disposed between the electron transport layer and the second electrode, and the electron transport layer might not include the n-dopant material.

The light receiving layer may include a donor compound and an acceptor compound, and the acceptor compound may include a fullerene derivative or a perylene tetracarboxylic diimide (PTCDI) derivative.

The electron extraction layer may include the n-dopant material and the acceptor compound.

The electron extraction layer may be a layer of a single material including the n-dopant material or a layer of a composite material including the n-dopant material and the acceptor compound.

The donor compound may include a phthalocyanine-based compound or a perylene-based compound.

The display element layer may further include a buffer layer disposed between the light emitting layer and the electron transport region and between the electron extraction layer and the electron transport region.

The buffer layer might not include the n-dopant material.

The hole transport region disposed under the light receiving layer may include a same material as the hole transport region disposed under the light emitting layer.

The electron transport region disposed on the light receiving layer may include a same material as the electron transport region disposed on the light emitting layer.

An electronic device includes a display module including a red light emitting area, a green light emitting area, a blue light emitting area, and a light receiving area, which are spaced apart from each other. The display module includes a base layer, a display element layer disposed on the base layer and including a light emitting element and a light receiving element, and an input sensing layer disposed on the display element layer. The display element layer includes a first electrode, a hole transport region disposed on the first electrode, an electron transport region disposed on the hole transport region, and a second electrode disposed on the electron transport region. The light emitting element includes a light emitting layer disposed between the hole transport region and the electron transport region, and the light receiving element includes a light receiving layer disposed between the hole transport region and the electron transport region and an electron extraction layer that is disposed on the light receiving layer and does not overlap the light emitting layer.

The electron extraction layer may include an n-dopant material.

The electron extraction layer may include a metal having a work function equal to or smaller than about 3.0 eV, a metal compound including a metal having a work function equal to or smaller than 3.0 eV an organic compound having a highest energy occupied molecular orbital (HOMO) level equal to or greater than about −3.0 eV, or a composite compound including an organic material having a HOMO level equal to or greater than about −3.0 eV.

The electron transport region may include an electron transport layer and an electron injection layer disposed between the electron transport layer and the second electrode, and the electron transport layer might not include the n-dopant material.

The light receiving layer may include a donor compound and an acceptor compound, and the acceptor compound may include a fullerene derivative or a perylene tetracarboxylic diimide (PTCDI) derivative.

The electron extraction layer might include only the n-dopant material or might include the n-dopant material and the acceptor compound.

The light emitting element may include a red light emitting element corresponding to the red light emitting area, a blue light emitting element corresponding to the blue light emitting area, and a green light emitting element corresponding to the green light emitting area.

An electronic device includes a base layer. A first electrode is disposed on the base layer and includes a light emitting electrode and a light receiving electrode spaced apart from the light emitting electrode. A pixel definition layer is disposed on the base layer and is provided with first and second openings through which the light emitting electrode and the light receiving electrode are exposed, respectively. A light emitting layer is disposed on the light emitting electrode in the first opening. A light receiving layer is disposed on the light receiving electrode in the second opening. An electron extraction layer is disposed on the light receiving layer in the second opening. A hole transport region is disposed between the light emitting electrode and the light emitting layer and between the light receiving electrode and the light receiving layer. An electron transport region entirely overlaps the pixel definition layer, the light emitting layer, and the light receiving layer. A second electrode is disposed on the electron transport region, and an encapsulation layer is disposed on the second electrode.

The electron extraction layer may include an n-dopant material.

The n-dopant material may include a metal having a work function equal to or smaller than about 3.0 eV or an organic compound having a highest energy occupied molecular orbital (HOMO) level equal to or greater than about −3.0 eV.

The electron transport region may include an electron transport layer and an electron injection layer disposed on the electron transport layer, and the electron transport layer might not include the n-dopant material.

The electronic device may further include a buffer layer disposed between the electron transport region and the light emitting layer and between the electron transport region and the light extraction layer, and the buffer layer might not include the n-dopant material.

The hole transport region may entirely overlap the pixel definition layer, the light emitting layer, and the light receiving layer.

BRIEF DESCRIPTION OF THE DRAWINGS

The above and other aspects of the present disclosure will become readily apparent by reference to the following detailed description when considered in conjunction with the to accompanying drawings wherein.

DETAILED DESCRIPTION

Figure 1:
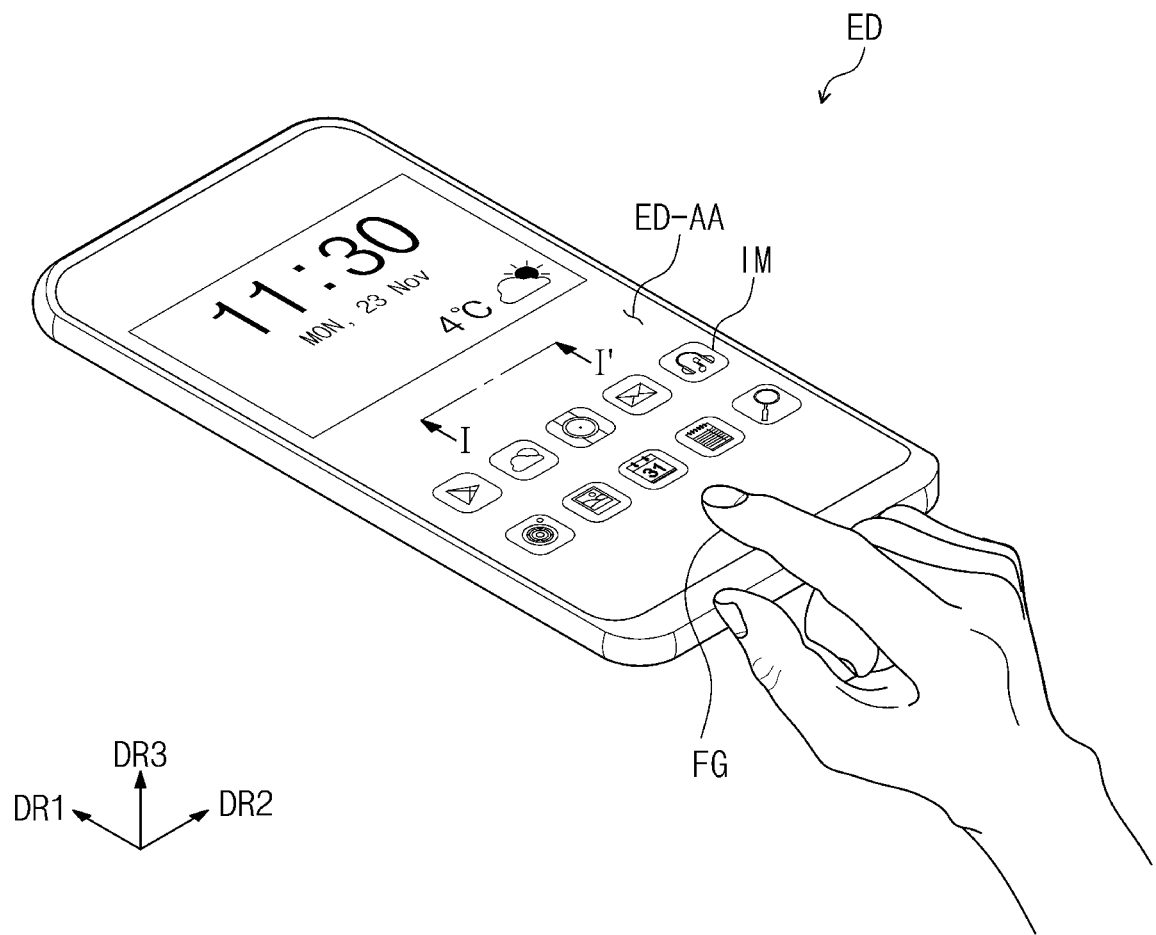
FIG. 1 is a perspective view showing an electronic device according to an embodiment of the present disclosure.

The present disclosure may be variously modified and realized in many different forms, and thus specific embodiments will be exemplified in the drawings and described in detail hereinbelow. However, the present disclosure should not necessarily be limited to the specific disclosed forms, and be construed to include all modifications, equivalents, or replacements included in the spirit and scope of the present disclosure.

It will be understood that when an element (or area, layer, or portion) is referred to as being "on", "connected to" or "coupled to" another element or layer, it can be directly on, connected or coupled to the other element or layer or intervening elements or layers may be present.

In the present disclosure, the expression "directly disposed" means that no intervening element, such as layer, film, area, or plate, between the element and other elements. For example, the expression "directly disposed" means that two layers or two members are disposed with no additional member such as an adhesive member therebetween.

Like numerals may refer to like elements throughout the specification and drawings. While the drawings show examples of the relative sizes and angles that may be used, it is to be understood that the invention is not necessarily limited to the relative sizes and angles shown and that differences may be present due to the limitations of manufacturing and other considerations.

As used herein, the term "and/or" includes any and all combinations of one or more of tip the, associated listed items.

It will be understood that, although the terms first, second, etc. may be used herein o describe various elements, these elements should not necessarily be limited by these terms. These terms may be used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above" "upper" and the like, may be used herein for ease of description to describe one element or feature's relationship to another element(s) or feature(s) as illustrated in the figures.

It will be further understood that the terms "comprises," "comprising," "includes," and/or "including", when used in this specification and claims, specify the presence of stated features, integers, steps, operations, elements, and/or components, but do not preclude the presence or addition of one or more other features, integers, steps, operations, elements, components, and/or groups thereof.

Hereinafter, an electronic device according to an embodiment of the present disclosure will be explained in detail with reference to the accompanying drawings.

Figure 2:
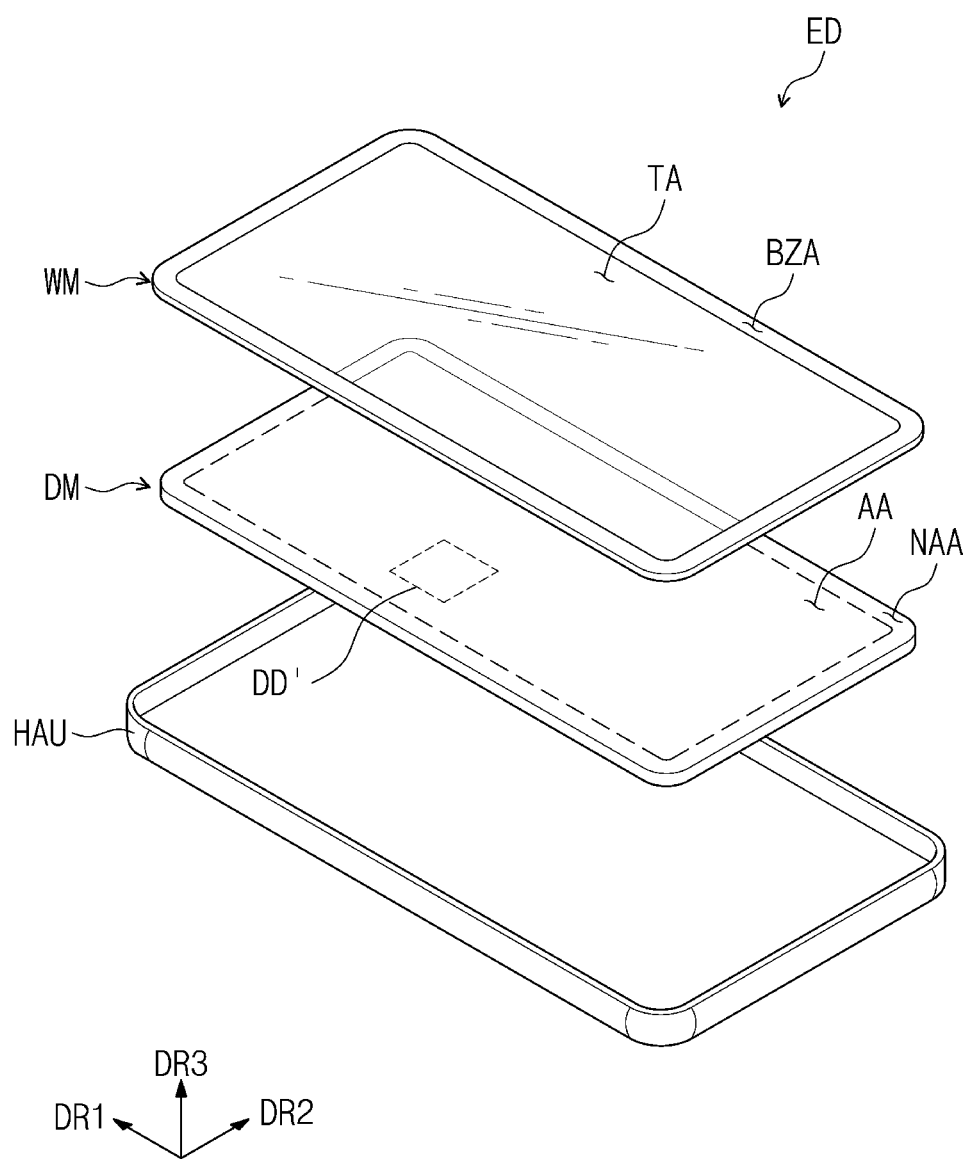
FIG. 2 is an exploded perspective view showing an electronic device according to an embodiment of the present disclosure.

FIG. 1 is a perspective view showing an electronic device ED according to an embodiment of the present disclosure. FIG. 2 is an exploded perspective view showing the electronic device ED according to an embodiment of the present disclosure, FIG. 3 is a cross-sectional view taken along a line I-I' of FIG. 1.

Figure 3:
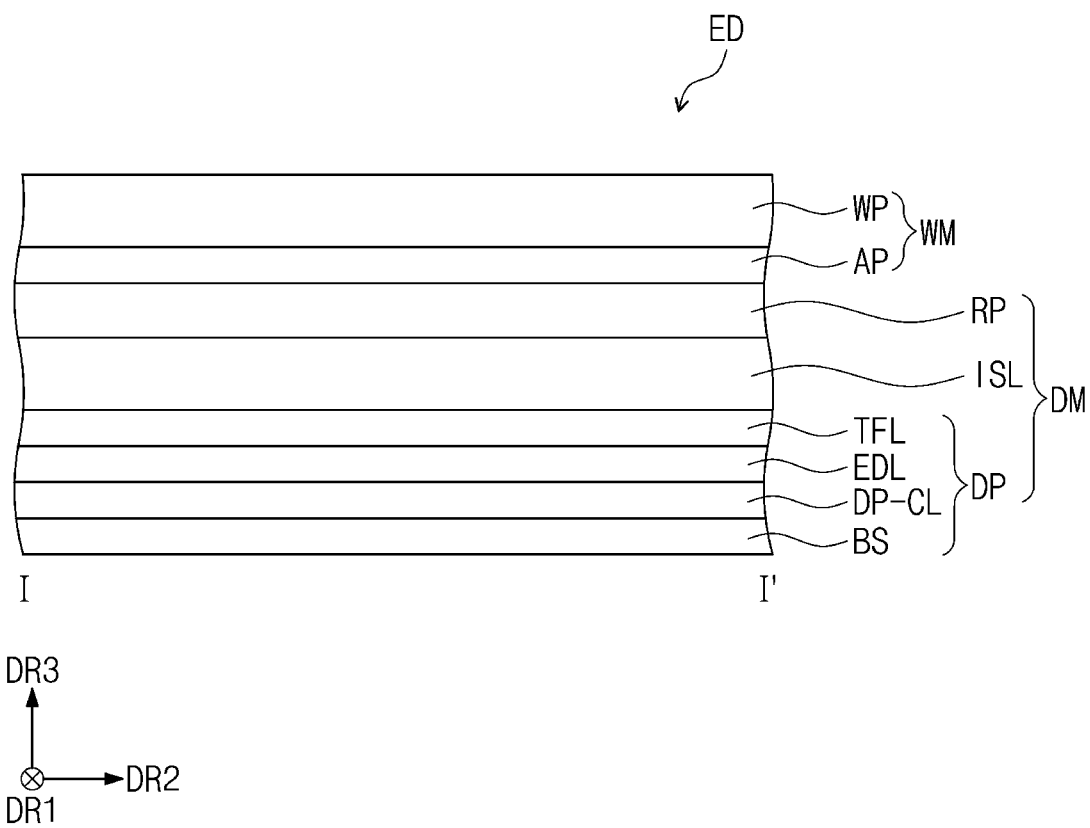
FIG. 3 is a cross-sectional view showing an electronic device according to an embodiment of the present disclosure.

The electronic device ED shown in FIGS. 1 to 3 may be a device activated in response to electrical signals. For example, the electronic device ED may be a mobile phone, a tablet computer, a car navigation unit, a game unit, or a wearable device, however, the present invention is not necessary limited thereto or thereby. FIG. 1 shows the mobile phone as a representative example of the electronic device ED.

The electronic device ED may display an image IM through an active area ED-AA. The active area ED-AA may include a plane defined by a first directional axis DR1 and a second directional axis DR2. The active area ED-AA may further include a curved surface bent from at least one side of the plane defined by the first directional axis DR1 and the second directional axis DR2. For example, the active area ED-AA may include only the plane, or the active area ED-AA may further include two or more curved surfaces, e.g., four curved surfaces respectively bent from four sides of the plane.

FIG. 1 and the following drawings show first, second, third, and fourth directional axes DR1, DR2, DR3, and DR4, and directions indicated by the first, second, third, and fourth directional axes DR1, DR2, DR3, and DR4 may be defined relative to each other and may be changed in other directions. In addition, the directions indicated by the first, second, third, and fourth directional axes DR1, DR2, DR3, and DR4 may be referred to as first, second, third, and fourth directions, respectively, and may be assigned with the same reference numerals as those of the first, second, third, and fourth directional axes DR1, DR2, DR3, and DR4.

In the following descriptions, the first directional axis DR1 may be substantially perpendicular to the second directional axis DR2, and the third directional axis DR3 may be a normal line direction of the plane defined by the first directional axis DR1 and the second directional axis DR2. The fourth directional axis DR4 may be a direction between the first directional axis DR1 and the second directional axis DR2.

A thickness direction of the electronic device ED may be substantially parallel to the third directional axis DR3 that is the normal line direction of the plane defined by the first directional axis DR1 and the second directional axis DR2. In the present embodiment, front (or upper) and rear or lower) surfaces of each member of the electronic device ED may be defined with respect to the third directional axis DR3.

According to an embodiment, the image IM provided from the electronic device ED may include a still image and/or a video image. FIG. 1 shows a clock widget and application icons as representative examples of the image IM. A surface through which the image IM is displayed may correspond to a front surface of the electronic device ED and a front surface of a window member WM.

According to an embodiment, the electronic device ED may sense a user input applied thereto. The user input may include various types of external inputs, such as a touch by a part of a user's body (e.g., a finger), light, heat, or pressure. According to an embodiment, the electronic device ED may sense the user input through the active area ED-AA and may respond the sensed input. In addition, the electronic device ED may sense the user input applied to a side or rear surface of the electronic device ED depending on its design, however, the present invention is not necessarily limited to a specific embodiment.

As an example, the electronic device ED may sense biometric information applied thereto, such as by a user's fingerprint FG. The electronic device ED may include a fingerprint recognition area defined in the active area ED-AA. The fingerprint recognition area may be defined in an entire portion of the active area ED-AA or may be defined in a portion of the active area ED-AA. The fingerprint recognition area may be an external input recognition area in which the external input as well as the biometric information of the user is sensed.

Referring to FIGS. 2 and 3, the electronic device ED may include a display module DM, the window member WM, and a housing HAU. According to an embodiment, the window member WM and the housing HAU may be coupled to each other to form an appearance of the electronic device ED.

According to an embodiment, the display module DM may include an active area AA and a peripheral area NAA at least partially surrounding the active area. AA. The active area AA may be activated in response to electrical signals. As described above, the active area AA may be an area in which the image is displayed or the external input is sensed.

The peripheral area NAA may be defined adjacent to at least one side of the active area AA. The peripheral area NAA may fully surround the active area AA, as shown, however, the present disclosure is not limited thereto or thereby. For example, according to an embodiment, portion of the peripheral area NAA may be omitted. A driving circuit or a driving line may be arranged in the peripheral area NAA to drive the active area AA.

Figure 5:
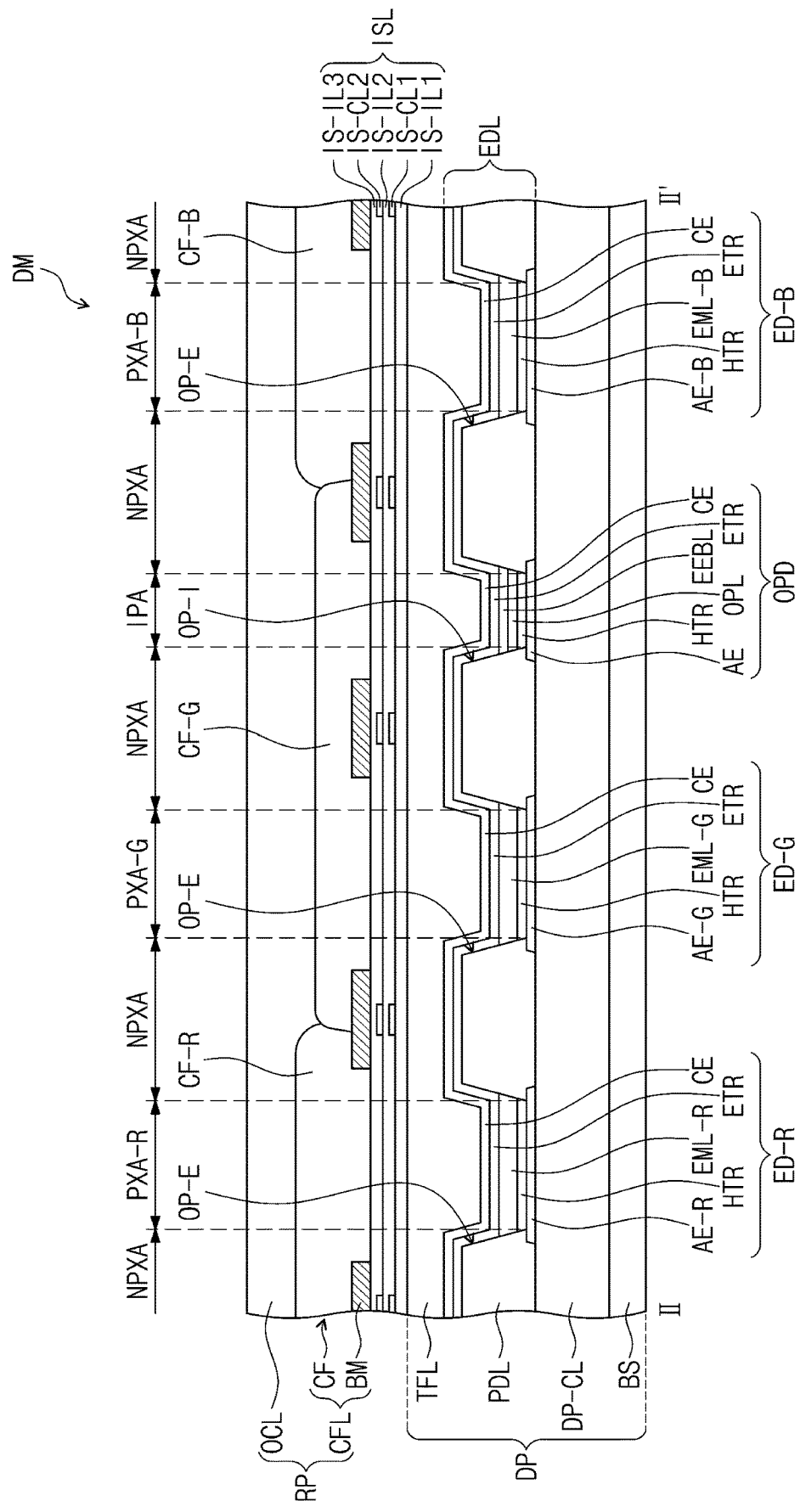
FIG. 5 is a cross-sectional view showing a portion of a display module according to an embodiment of the present disclosure

According to an embodiment, the electronic device ED may include light emitting elements ED-R, ED-G, and ED-B (refer to FIG. 5) and a light receiving element OPD (refer to FIG. 5). For example, the electronic device ED may display the image through an operation of the light emitting elements ED-R, ED-G, and ED-B (refer to FIG. 5) and may sense the external input through an operation of the light receiving element OPD (refer to FIG. 5).

According to an embodiment, the display module DM may include a display panel DP and an input sensing layer ISL disposed on the display panel DP. In addition, the display module DM may include an anti-reflective member RP. According to an embodiment, the anti-reflective member RP may be disposed on the input sensing layer ISL. In addition, when the input sensing layer ISL is omitted, the anti-reflective member RP may be disposed on the display panel DP.

The display panel OP may include a base layer BS and a display element layer EDL disposed on the base layer BS. In addition, the display panel DP may include the base layer BS, a circuit layer DP-CL disposed on the base layer BS, the display element layer EDL disposed on the circuit layer DP-CL, and an encapsulation layer TFL disposed on the display element layer EDL. The encapsulation layer TFL may cover the display element layer EDL.

The electronic device ED may further include the window member WM disposed on the display nodule DM. The window member WM may include a window WP and an adhesive layer AP, and the adhesive layer AP may be disposed between the display module DM and the window WP. The adhesive layer AP may be an optically clear adhesive (OCA) film or an optically clear adhesive resin (OCR) layer. According to an embodiment, the adhesive layer AP may be omitted.

The window WP may cover an entire titer side of the display module DM. The window WP may have a shape corresponding to a shape of the display module DM. According to an embodiment, the window WP of the electronic device ED may include an optically transparent insulating material. The window WP may be a glass substrate or a polymer substrate. As an example, the window WP may be a tempered glass substrate. The window WP may be an uppermost layer of the electronic device ED.

In addition, according to an embodiment, the window member WM of the electronic device ED may include a transmissive area TA and a bezel area BZA that at least partially surrounds the transmissive area TA. The transmissive area TA may correspond to the active area AA of the display module DM, and the bezel area BZA may correspond to the peripheral area NAA of the display module DM.

The front surface of the window member WM, which includes the transmissive area TA and the bezel area BZA, may correspond to the front surface of the electronic device ED. The user may view the image provided through the transmissive area TA corresponding to the front surface of the electronic device ED.

The bezel area BZA may define a shape of the transmissive area TA. The bezel area BZA may be adjacent to the transmissive area TA and may fully surround the transmissive area TA, as shown, however, the present embodiment is not necessarily limited thereto or thereby. According to an embodiment, the bezel area BZA may be disposed adjacent to only one side of the transmissive area TA or may be partially omitted.

According to an embodiment, a portion of the electronic device ED, which is recognized through the bezel area BZA of the electronic device ED, may have a relatively low light transmittance compared with that of a portion of the electronic device ED, which is recognized through the transmissive area TA of the electronic device ED. In addition, the bezel area BZA of the electronic device ED may be pigmented to be of a predetermined color.

According to an embodiment, the anti-reflective member RP of the electronic device ED may include a color filter layer or a polarization layer. As an example, the anti-reflective member RP may reduce a reflectance of an external light incident or may absorb and block a portion of the external light incident thereto.

According to an embodiment, the input sensing layer ISL included in the electronic device ED may be disposed on the display panel DP. The input sensing layer ISL may sense an external input applied thereto. The external input may be the user input. The user input may include various types of external inputs, such as a part of a user's body, light, heat, pen, or pressure.

Figure 4:
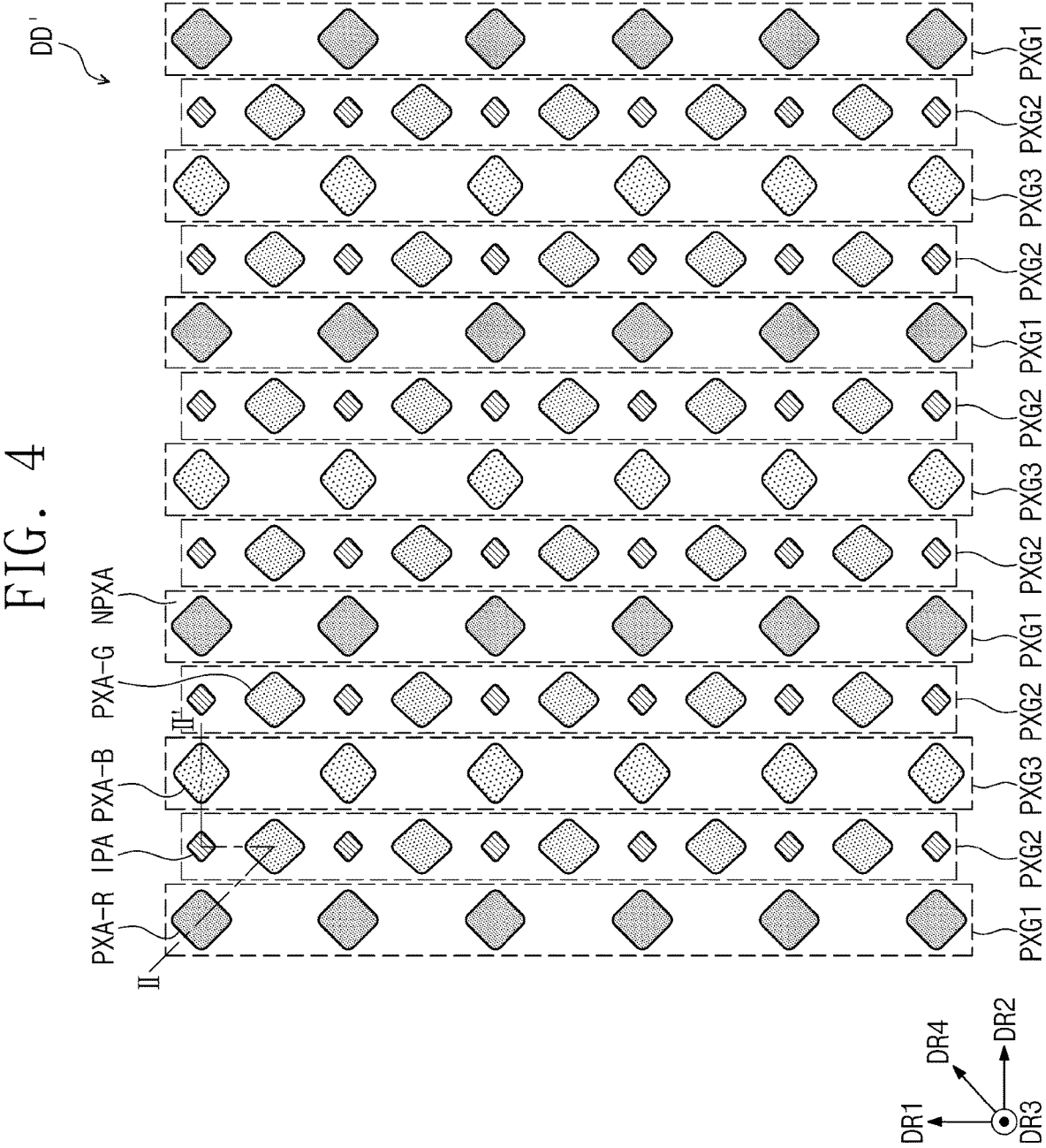
FIG. 4 is a plan view showing a portion of a display module according to an embodiment of the present disclosure.

FIG. 4 is a plan view showing a portion of the display module according to an embodiment of the present disclosure, and FIG. 5 is a cross-sectional view showing a portion of the display module DM according to an embodiment of the present disclosure. FIG. 4 is a plan view showing an area DD' of FIG. 2, and FIG. 5 is a cross-sectional view taken along a line II-II' of FIG. 4.

According to an embodiment, the display module DM may include a plurality of light emitting areas PXA-R, PXA-G, and PXA-B and a light receiving area IPA, which are arranged in the active area AA. The display module DM may include a red light emitting area PXA-R emitting a red light, a green light emitting area PXA-G emitting a green light, and a blue light emitting area PXA-B emitting a blue light. In addition, the display module DM may include the light receiving area IPA that receives and senses light incident thereto after being reflected by an external object. A non-light-emitting area NPXA may be defined between the light emitting areas PXA-R, PXA-G, and PXA-B and between the light emitting areas PXA-R, PXA-G, and PXA-B and the light receiving area IPA. The light emitting areas PXA-R, PXA-G, and PXA-B may be distinguished from each other by the non-light-emitting area NPXA, and the light emitting areas PXA-R, PXA-G, and PXA-B may be distinguished from the light receiving area IPA by the non-light-emitting area NPXA. The non-light-emitting area NPXA may at least partially surround each of the light emitting areas PXA-R, PXA-G, and PXA-B and the light receiving area IPA.

According to an embodiment, the light emitting areas emitting light in different wavelength ranges among the light emitting areas PXA-R, PXA-G, and PXA-B may have different sizes from each other. In this case, the size may mean a size when viewed in a plane defined by the first directional axis DR1 and the second directional axis DR2.

However, the embodiment is not necessarily limited thereto or thereby. According to an embodiment, the light emitting areas PXA-R, PXA-G, and PXA-B may have substantially the same size as each other, or the light emitting areas PXA-R, PXA-G, and PXA-SB may have a size ratio different from that shown in FIG. 4. The light emitting areas PXA-R, PXA-G, and PXA-B may emit a light having a color rather than the red light, the green light, and the blue light and may have a planar shape different from that shown in FIG. 4.

According to an embodiment, the light receiving area IPA may have a size that is smaller than the size of each of the red light emitting area PXA-R, the blue light emitting area PXA-B, and the green light emitting area PXA-G when viewed in a plane, however, the present invention is not necessarily limited thereto or thereby. According to an embodiment, the size of the light receiving area IPA may be equal to or greater than that of one of the red light emitting area PXA-R, the blue light emitting area PXA-B, and the green light emitting area PXA-G.

Each of the red light emitting area PXA-R, the blue light emitting area PXA-B, and the green light emitting area PXA-G may be provided in plural. The light receiving area IPA may be provided in plural. Referring to FIG. 4, the red light emitting areas PXA-R may be arranged in the first directional axis DR1 and may be spaced apart from each other to forty a first group PXG1. The green light emitting areas PXA-G may be alternately arranged with the light receiving areas IPA in the first directional axis DR1 to form a second group PXG2. In addition, the blue light emitting areas PXA-B may be arranged in the first directional axis DR1 and may be spaced apart from each other to form a third group PXG3.

The first group PXG1 to the third group PXG3 may be sequentially arranged in the second directional axis DR2. Each of the first group PXG1, the second group PXG2, and the third group PXG3 may be provided in plural. In the embodiment shown in FIG. 4, the first group PXG1, the second group PXG2, the third group PXG3, and the second group PXG2 arranged along the second directional axis DR2 may form one repeating unit, and these repeating units may be repeatedly arranged in the second directional axis DR2.

According to an embodiment, one green light emitting area PXA-G may be spaced apart from one red light emitting area PXA-R or one blue light emitting area PXA-B in the fourth directional axis DR4. The fourth directional axis DR4 may be a direction between the first directional axis DR1 and the second directional axis DR2.

In addition, according to in embodiment, the light receiving area IPA may be spaced apart from each of the light emitting areas PXA-R, PXA-G, and PXA-B and may be disposed between the red light emitting area PXA-R and the blue light emitting area PXA-B and spaced apart from the red light emitting area PXA-R and the blue light emitting area PXA-B in the second directional axis DR2. The light receiving area IPA may be alternately arranged with the green light emitting area PXA-G in the first directional axis DR1.

The arrangement structure of the light emitting areas PXA-R, PXA-G, and PXA-B shown in FIG. 4 may be called a pentile structure (PENTILE®). Here "PENTILE" is an arrangement of five subpixels marketed by SAMSUNG. However, the arrangement structure of the light emitting areas PXA-R, PXA-G, and PXA-B in the electronic device are not necessarily limited to the arrangement structure shown in FIG. 4. As an example, according to an embodiment, the light emitting areas PXA-R, PXA-G, and PXA-B may have a stripe structure in which the red light emitting area PXA-R, the green light emitting area PXA-G, and the blue light emitting area PXA-B are sequentially and alternately arranged with each other in the first directional axis DR1 or the second directional axis DR2. In addition, in the stripe structure, the light receiving area IPA may be arranged in the same row or in the same column as the green light emitting area PXA-G to form one stripe arrangement. However, according to an embodiment, an arrangement shape of the light receiving area IPA and the light emitting areas PXA-R, PXA-G, and PXA-B and an arrangement ratio of the light receiving area IPA and the light emitting areas PXA-R, PLA-G, and PXA-B may be different from the above arrangement shape and arrangement ratio.

FIG. 5 is a cross-sectional view showing a portion of the display module DM according to an embodiment of the present disclosure. FIG. 5 is a cross-sectional view showing portions of the light emitting areas PXA-R, PXA-G, and PXA-B and the light receiving area IPA as a representative example. For example, FIG. 5 is a cross-sectional view showing a portion of the electronic device ED (refer to FIG. 3) according to an embodiment.

According to an embodiment, the electronic device may include the light emitting elements ED-R, ED-G, and ED-B and the light receiving element OPD. The light emitting elements ED-R, ED-G, and ED-B may emit light in response to electrical signals. In addition, the light receiving element OPD may receive an optical signal and may convert the optical signal into an electrical signal.

Referring to FIG. 5, the electronic device may include the base layer BS, the display element layer EDL disposed on the base layer BS, the input sensing layer ISL disposed on the display element layer EDL, and the anti-reflective member RP disposed on the input sensing layer ISL. The display element layer EDL may include a pixel definition layer PDL, the light emitting elements ED-R, ED-G, and ED-B, and the light receiving, element OPD distinguished from the light emitting elements ED-R, ED-G, and ED-B by the pixel definition layer PDL. In addition, the anti-reflective member RP may include a color filter layer CFL and an organic phmarization layer OCL.

According to an embodiment, the light emitting elements ED-R, ED-G, and ED-B may include respective first electrodes AE-R, AE-G, and AE-B, a hole transport region HTR, respective light emitting layers EML-R, EML-G, and EML-B, an electron transport region ETR, and a second electrode CE. In addition, the light receiving element OPD may include a first electrode AE, the hole transport region HTR, a light receiving layer OPL, an electron extraction layer EEBL, the electron transport region ETR, and the second electrode CE.

According to an embodiment, the light receiving layer OPL included in the light receiving element OPD may be a photoactive layer that converts a light incident thereto into an electrical signal. The light receiving element OPD may separate the light incident thereto into electrons and holes and may deliver the electrons and the holes to each electrode.

Figure 6:
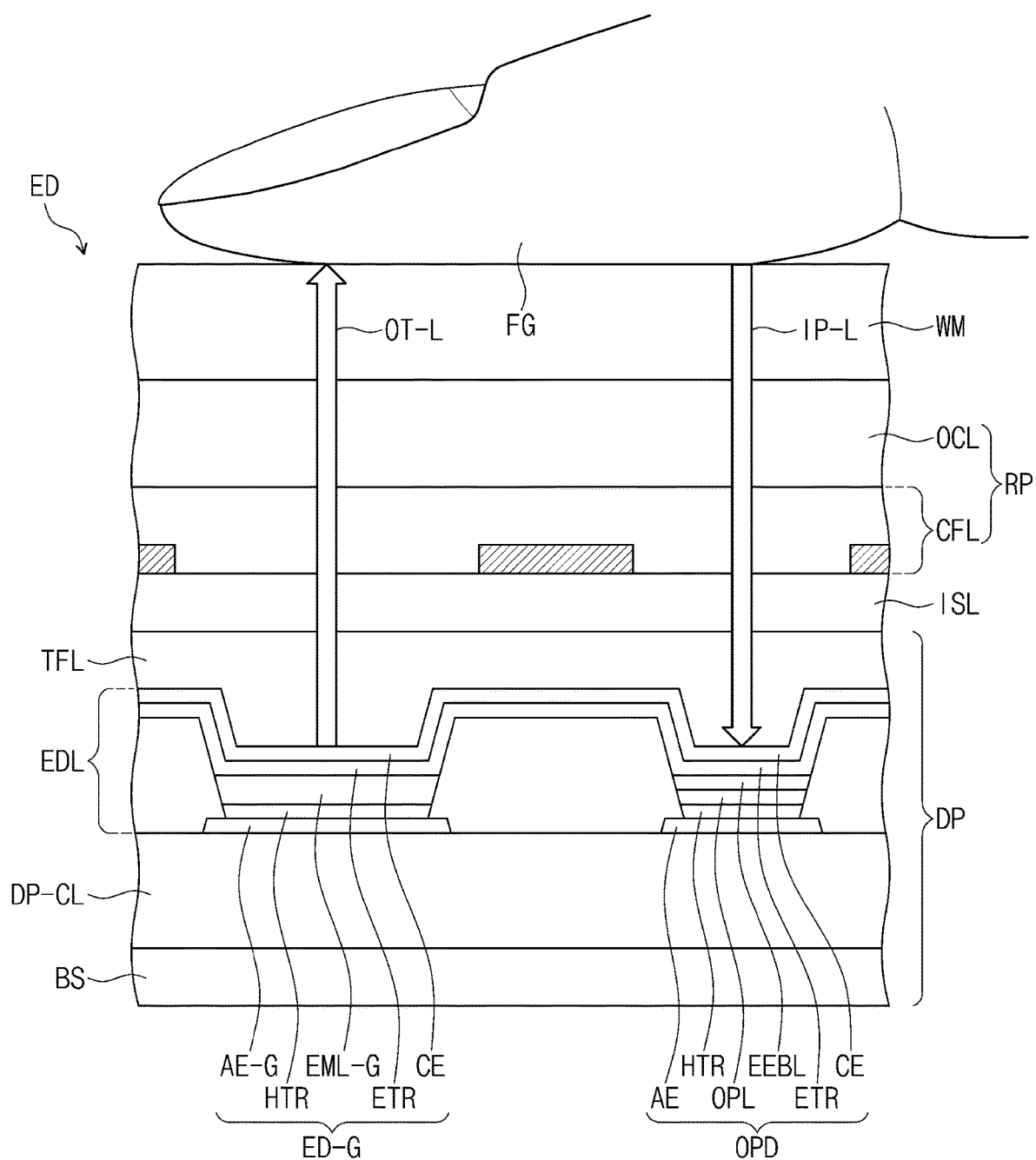
FIG. 6 is a cross-sectional view showing an electronic device according to an embodiment of the present disclosure.

FIG. 6 is a cross-sectional view showing a portion of the electronic device ED according to an embodiment. FIG. 6 schematically shows an operation of the light emitting element and the light receiving element. Referring to FIG. 6, a light OT-L emitted from the light emitting element ED-G included in the display element layer EDE of the electronic device ED may be reflected by an external object, e.g., the fingerprint FG, and may be incident to the light receiving element OPD included in the display element layer EDL as a reflective light IP-L. The reflective light IP-L incident to the light receiving element OPD may be a light in a visible light region. The light receiving element OPD may receive the light and may convert the light incident thereto into the electrical signal to sense the external input, and thus, the light receiving element may change an operating state of the electronic device ED.

For example, the light emitted from the light emitting element ED-G and reflected by the external object may be incident to the light receiving element OPD, and the boles and the electrons may be separated from each other by the incident light in the light receiving layer OPL of the light receiving element OPD and may be provided to each of the electrodes AE and CE. Accordingly, the optical signal may be converted into the electrical signal.

Referring to FIG. 5 again, the electron extraction layer EEBL may be disposed on the light receiving layer OPL. As an example, the electron extraction layer EEBL may be disposed directly on the light receiving layer OPL. According to an embodiment, the light receiving element OPD may include the electron extraction layer EEBL to allow the electrons formed in the light receiving layer OPL to move more easily. For example, the light receiving element OPD may include the electron extraction layer EEBL disposed between the light receiving layer OPL and the electron transport region ETR and thus may increase a photoelectric efficiency of converting the received light into the electrical signal.

According to an embodiment, the electron extraction layer EEBL may be included in the light receiving element OPD and might not be included in the light emitting elements ED-R, ED-G, and ED-B. The electron extraction layer EEBL might not overlap the light emitting layers EML-R, EML-G, and EML-B.

The electron extraction layer EEBL may be disposed on the light receiving layer OPL and may include an n-dopant material. The electron extraction layer EEBL may be disposed directly on the light receiving layer OPL. The electron extraction layer EEBL, may have a single-layer or multi-layer structure. For example, the electron extraction layer EEBL may have the single-layer structure including the n-dopant material or the multi-layer structure in which plural different layers including the n-dopant material are stacked.

The n-dopant material included in the electron extraction layer EEBL may include a metal having a work function equal to or smaller than about 3.0 eV. In addition, the n-dopant material included in the electron extraction layer EEBL may include an organic compound having a highest energy occupied molecular orbital (HOMO) level equal to or greater than about −3.0 eV. As an example, the electron extraction layer EEBL may include the metal having the work function equal to or smaller than about 3.0 eV, a metal compound including the metal having the work function equal to or smaller than about 3.0 eV, the organic compound having the HOMO level equal to or greater than about −3.0 eV, or an organic-inorganic complex compound including an organic material having the HOMO level equal to or greater than about −3.0 eV and an inorganic compound.

According to an embodiment, the n-dopant material included in the electron extraction layer EEBL may include Ca, Yb, K, Cs, Rb, or Li. As an example, the electron extraction layer EEBL may include the n-dopant material including Ca, Yb, K, Cs, Rb, Li, or a compound thereof. The compound including Li may include LiF or LiQ, however, the present invention is not necessarily limited thereto or thereby. In addition, the election extraction layer EEBL may include KI as the n-dopant material. According to an embodiment, the material for the electron extraction layer EEBL is not necessarily limited to the above-mentioned materials, and the electron extraction layer EEBL may include the metal satisfying a condition in which the work function is equal to or smaller than about 3.0 eV or the organic compound satisfying a condition in which the HOMO level is equal or greater than about −3.0 eV as the n-dopant material in addition to the above-mentioned materials.

According to an embodiment, the light receiving element OPD of the electronic device may include the electron extraction layer EEBL disposed on the light receiving layer OPL, and the electron extraction layer EEBL may include the metal having the work function equal to or smaller than about 3.0 eV or the organic compound having the HOMO level equal to or greater than about −3.0 eV to allow the electrons generated in the light receiving layer OPL to be more easily transferred to the electron transport region ETR. For example, according to an embodiment, the electron extraction layer EEBL may include the metal having the work function equal to or smaller than about 3.0 eV or the organic compound having the HOMO level equal to or greater than about −3.0 eV to allow the holes of the electron transport region ETR adjacent to the electron extraction layer EEBL to move to the electron extraction layer EEBL, and thus, the electrons may more easily move to the electron transport region ETR via the electron extraction layer EEBL. Accordingly, the light receiving element OPD may provide excellent photoelectric efficiency.

Referring to FIG. 5, the display module DM of the electronic device may include the base layer BS. The base layer BS may be a member that provides a base surface on which the display element layer EDL is disposed. The base layer BS may be a glass substrate, a metal substrate, or a polymer substrate. However, the embodiment is not necessarily limited thereto or thereby, and the base layer BS may be an inorganic layer, an organic layer, or a composite material layer.

The base layer BS may have a multi-layer structure. For instance, the base layer BS may have as three-layer structure of a synthetic resin layer, an adhesive layer, and a synthetic resin layer. The synthetic resin layer may include a polyimide-based resin. In addition, the synthetic resin layer may include an acrylate-based resin, a methacrylate-based resin, a polyisoprene-based resin, a vinyl-based resin, an epoxy-based resin, a urethane based resin, a cellulose-based resin, a siloxane-based resin, a polyamide-based resin, and/or a perylene-based resin. In the present disclosure, the term "X-based resin", as used herein, refers to the resin that includes a functional group of X.

The circuit layer DP-CL may be disposed on the base layer BS. The circuit layer DP-CL may include an insulating layer, a semiconductor pattern, a conductive pattern, and a signal line. An insulating layer, a semiconductor layer, and a conductive layer may be formed on the base layer BS by a coating or depositing process. Then, the insulating layer, the semiconductor layer, and the conductive layer may be selectively patterned through several photolithography processes. The semiconductor pattern, the conductive pattern, and the signal line included in the circuit layer DP-CL may be formed.

The display element layer EDL may be disposed on the circuit layer DP-CL. The display element layer EDL may include the light emitting elements ED-R, ED-G, and ED-B and the light receiving element OPD. As an example, the light emitting elements ED-R, ED-G, and ED-B included in the display element layer EDL may include an organic light emitting element, a quantum dot light emitting, element, a micro-LED light emitting element, or a nano-LED light emitting element, however, they are not necessarily limited thereto or thereby. According to an embodiment, the light emitting elements ED-R, ED-G, and ED-B may be implemented in various ways as long as the light is generated in response to the electrical signal or an amount of the light may be controlled.

In addition, according to an embodiment, the light receiving element OPD may be an optical sensor that receives and recognizes the light reflected by the external object. For example, the light receiving element OPD may be an optical sensor that recognizes the light in the visible light region, which is reflected by the external object. According to an embodiment, the light receiving element OPD may be a biometric sensor that recognizes the light reflected from the user's body part, such as a fingerprint or vein, and converts the optical signal into the electrical signal.

The display element layer EDL may include the pixel definition layer PDL through which openings OP-E and OP-I are defined, and the light emitting elements ED-R, ED-G, and ED-B and the light receiving element OPD may be separated and distinguished from each other with respect to the pixel definition layer PDL. The pixel definition layer PDL may include a first opening OP-E in which parts of the light emitting elements ED-R, ED-G, and ED-B are disposed and a second opening OP-I in which parts of the light receiving element OPD are disposed.

The pixel definition layer PDL may be disposed on the base layer BS. The pixel definition layer PDL may be disposed on the circuit layer DP-CL, and portions of upper surfaces of the first electrodes AE-R, AE-G, AE-B, and AE may be exposed in the openings OP-E and OP-I. In the present embodiment, the light emitting areas PXA-R, PXA-G, and PXA-B and the light receiving area IPA may correspond to the first electrodes AE-R, AE-G, AE-B, and AE exposed through the openings OP-E and OP-I.

According to an embodiment, the pixel definition layer PDL may include a polymer resin. As an example, the pixel definition layer PDL may include a polyacrylate-based resin or a polyimide-based resin. In addition, the pixel definition layer PDL may further include an inorganic material in addition to the polymer resin. The pixel definition layer PDL may include a light absorbing material or may include a black pigment or a black dye. The pixel definition layer PDL including the black pigment Or the black dye may be implemented as a black pixel definition layer. When the pixel definition layer PDL is formed, a carbon black may be used as the black pigment or the black dye, however, the embodiment is not necessarily limited thereto or thereby.

In addition, the pixel definition layer PDL may include an inorganic material. As an example, the pixel definition layer PDL may include silicon nitride ($SiN_x$), silicon oxide ($SiO_x$), and/or silicon oxynitride ($SiO_xN_y$).

The light emitting elements ED-R, ED-G, and ED-B may respectively include the first electrodes AE-R, AE-G, and AE-B, may include the second electrode CE, and may respectively include the light emitting layers EML-R, EML-G, and EML-B. The first electrodes AE-R, AE-G, and AE-B may be exposed through the first opening OP-E. In the present disclosure, the first electrodes AE-R, AE-G, and AE-B forming the light emitting elements ED-R, ED-G, and ED-B may be referred to as a light emitting electrode.

According to an embodiment, the display element layer EDL may include a red light emitting element ED-R corresponding to the red light emitting area PXA-R and emitting the red light, a green light emitting element ED-G corresponding to the green light emitting area PXA-G and emitting the green light, and a blue light emitting element ED-B corresponding to the blue light emitting area PXA-B and emitting the blue light. The red light emitting element ED-R may include the first electrode AE-R, the second electrode CE facing the first electrode AE-R, and a red light emitting layer EML-R disposed between the first electrode AE-R and the second electrode CE. The green light emitting element ED-G may include the first electrode AE-G, the second electrode CE facing the first electrode AE-G, and a green light emitting layer EML-G disposed between the first electrode AE-G and the second electrode CE, and the blue light emitting element ED-B may include the first electrode AE-B, the second electrode CE facing the first electrode AE-B, and a blue light emitting layer EML-B disposed between the first electrode AE-B and the second electrode CE.

The light receiving element OPD may include the first electrode AE, the second electrode CE, the light receiving layer OPL, and the electron extraction layer EEBL. The first electrode AE may be exposed through the second opening OP-I. In the present disclosure, the first electrode AE of the light receiving element OPD may be referred to as a light receiving electrode.

Figure 7A:
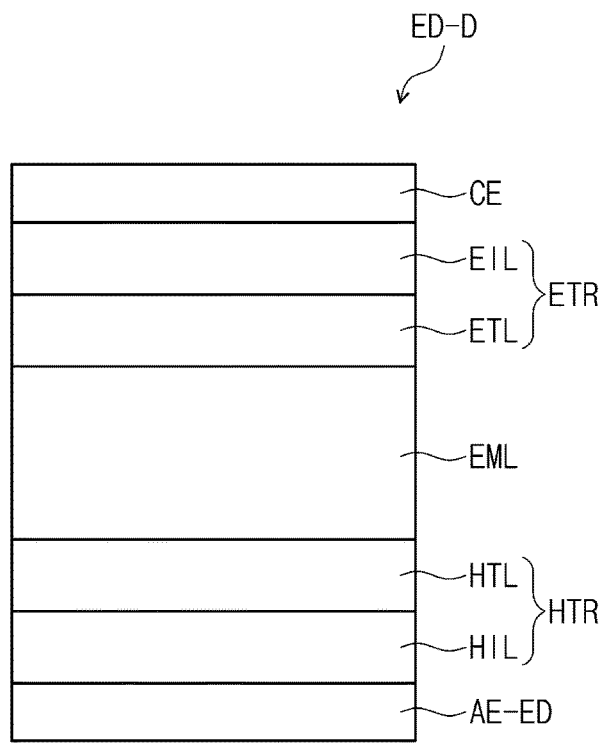
FIG. 7A is a cross-sectional view showing a light emitting element according to an embodiment of the present disclosure.
Figure 7B:
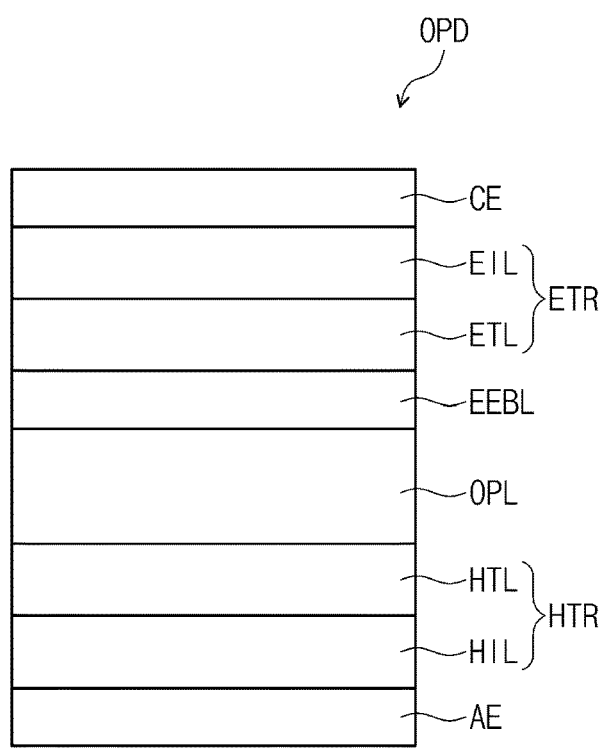
FIG. 7B is a cross-sectional view showing a light receiving element according to an embodiment of the present disclosure.

FIGS. 7A and 7B are cross-sectional views showing a light emitting element ED-D and a light receiving element OPD. FIG. 7A is a cross-sectional view showing the light emitting element ED-D according to an embodiment of the present disclosure, and FIG. 7B is a cross-sectional view showing the light receiving element OPD according to an embodiment of the present disclosure.

The light emitting element ED-D, according to an embodiment shown in FIG. 7A, represents each of the light emitting elements ED-R, ED-G, and ED-B in FIG. 5. The light emitting element ED-D shown in FIG. 7A is different from each of the light emitting elements ED-R, ED-G, and ED-B only in configuration of the light emitting layer.

Referring to FIG. 7A, the light emitting element ED-D may include a first electrode AE-ED, a hole transport region HTR, a light emitting layer EML, an electron transport region ETR, and a second electrode CE, which are sequentially stacked. The hole transport region HTR may include a hole injection layer HIL and a hole transport layer HTL, and the electron transport region ETR may include an electron injection layer EIL and an electron transport layer ETL.

Referring to FIG. 7B, the light receiving element OPD may include a first electrode AE, a hole transport region HTR, a light receiving layer OPL, an electron extraction layer EEBL, an electron transport region ETR, and a second electrode CE, which are sequentially stacked. The hole transport region HTR may include a hole injection layer HIL and a hole transport layer HTL, and the electron transport region ETR may include an electron injection layer EIL and an electron transport layer ETL. The electron extraction layer EEBL may be disposed between the light receiving layer OPL and the electron transport layer ETL.

In the light emitting element ED-D and the light receiving element OPD shown in FIGS. 7A and 7B, the first electrodes AE-ED and AE may include a metal, a metal alloy, or a conductive compound. The first electrodes AE-ED and AE may be an anode or a cathode, however, they are not necessarily limited thereto or thereby. In addition, the first electrodes AE-ED and AE may be a pixel electrode or a sensing electrode. The first electrodes AE-ED and AE may be a transmissive electrode, a transflective electrode, or a reflective electrode. When the first electrodes AE-ED and AE are the transmissive electrode, the first electrodes AE-ED and AE may include a transparent metal oxide, e.g., indium tin oxide (ITO), indium zinc oxide (IZO), zinc oxide (ZnO), indium tin zinc oxide (ITZO), etc. When the first electrodes AE-ED and AE are the transflective electrode or the reflective electrode, the first electrodes AE-ED and AE may include Ag, Mg, Cu, Al, Pt, Pd, Au, Ni, Nd, Ir, Cr, Li, Ca, LiF/Ca, LIF/Al, Mo, Ti, W, a compound thereof, or a mixture thereof, e.g., a mixture of Ag and Mg.

The second electrode CE may be a common electrode. The second electrode CE may be the cathode or the anode, however, the present invention is not necessarily limited thereto thereby. As an example, when the first electrodes AE-ED and AE are the anode, the second electrode CE may be the cathode, and when the first electrodes AE-ED and AE are the cathode, the second electrode CE may be the anode.

The second electrode CE may be the transmissive electrode, the transflective electrode, or the reflective electrode. When the second electrode CE is the transmissive electrode, the second electrode CE may include a transparent metal oxide, e.g., indium tin oxide (ITO), indium zinc oxide (IZO), zinc oxide (ZnO), indium tin zinc oxide (ITZO), etc. When the second electrode CE is the transflective electrode or the reflective electrode, the second electrode CE may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof, e.g., AgMg, AgYb, or MgYb.

The first electrodes AE-ED and AE respectively included in the light emitting element ED-D and the light receiving element OPD may be the transflective electrode or the reflective electrode, and the second electrode CE included in the light emitting element ED-D and the light receiving element OPD may be the transmissive electrode or the transflective electrode. For example, according to an embodiment, the light emitting element ED-D and the light receiving element OPD may include the transmissive or transflective second electrode CE, and thus, the light reflected by the external object may be more easily transmitted to the light receiving element OPD.

The hole transport region HTR may have a single-layer structure of a single material, a single-layer structure of plural different materials, or a multi-layer structure of layers formed of plural different materials. For example, different from those shown in figures, the hole transport region HTR may be provided as one layer instead of being divided into plural layers.

Referring to FIGS. 7A and 7B, the hole transport region HTR may include the hole injection layer HIL and the hole transport layer HTL, which are sequentially stacked. The hole transport region HTR may further include at least one of a hole buffer layer, a light emitting auxiliary layer, and an electron blocking layer.

The hole injection layer HIL may include a phthalocyanine compound such as copper phthalocyanine, DNTPD($N^1$, $N^{1'}$-([1,1'-biphenyl]-4,4'-diyl)bis($N^1$-phenyl-$N^4$,$N^4$-di-m-tolylbenzene-1,4-diamine)), m-MTDATA(4,4',4"-[tris(3-methylphenyl)phenylamino]triphenylamine) TDATA(4, 4'4"-Tris(N,N-diphenylamino)triphenylamine), 2-TNATA (4,4',4"-tris[N(2-naphthyl)-N-phenylamino]-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphorsulfonicacid), PANI/PSS (Polyaniline/Poly(4-styrenesulfonate)) NPB(N,N'-di(naphthalene-1-yl)-N,N'-diphenyl-benzidine), poly(ether ketone)-containing triphenylamine (TPAPEK), 4-Isopropyl-4'-methyldiphenyliodonium [Tetrakis(pentafluorophenyl) borate], HAT-CN(dipyrazino[2,3-f: 2',3'-h] quinoxaline-2,3,6,7,10,11-hexacarbonitrile), etc.

The hole transport layer HTL may include carbazole-based derivatives, e.g., n-phenyl carbazole, polyvinyl carbazole, etc., fluorene-based derivatives, triphenylamine-based derivatives, e.g., TPD(N,N'-bis(3-methylphenyl)-N, N'-diphenyl-[1,1'-biphenyl]-4,4'-diamine), TCTA(4,4',4"-tris(N-carbazolyl)triphenylamine), etc., NPB(N,N'-di(naphthalene-1-yl)-N,N'-diphenyl-benzidine), TAPC(4,4'-Cyclohexylidene bis[N,N-bis(4-methylphenyl)benzenamine]), HMTPD(4,4'-Bis[N,N'-(3-tolyl)amino]-3, 3'-dimethylbiphenyl), mCP(1,3-Bis(N-carbazoyl)benzene), etc.

However, the embodiment is not necessarily limited thereto or thereby, and the hole injection layer and the hole transport layer HTL may include a known material for the hole injection layer or a known material for the hole transport layer in addition to the above-mentioned materials.

The light emitting layer EML of the light emitting element ED-D may be disposed on the hole transport region HTR. The light emitting layer EML may have a single-layer structure of a single material, a single-layer structure of plural different materials, or a multi-layer structure of layers formed of plural different materials.

According to an embodiment, the light emitting layer EML may include an organic light emitting material or a quantum dot material. As an example, the light emitting layer EML may include anthracene derivatives, pyrene derivatives, fluoranthene derivatives, chrysene derivatives, dihydrobeozanthracene derivatives, or triphenylene derivatives as the organic light emitting material.

In addition, the light emitting layer EML of the light emitting element ED-D may include a host and a dopant. The light emitting layer EML may include an organic fluorescent dopant material, an organic phosphorescent dopant material, a thermally activated delayed fluorescent dopant material, or a phosphorescent dopant material of an organometallic complex as the dopant material.

The light emitting layer EML may include at least one of DPREPO(Bis[2-(diphenylphosphino)phenyl] ether oxide), CBP(4,4'-Bis(carbazol-9-yl)biphenyl), mCP(1,3-Bis(carbazol-9-yl)benzene), PPF (2,8-Bis(diphenylphosphoryl) dibenzo[b,d]furan), TCTA(4,4'4"-Tris(carbazol-9-yl)-triphenylamine), and TPBi(1,3,5-tris(1-phenyl-1H-benzo[d] imidazole-2-yl)benzene as the host material, however, the present invention is not necessarily limited thereto or thereby. As an example, the light emitting layer EML may include $Alq_3$(tris(8-hydroxyquinolino)aluminum), CBP(4, 4'-bis(N-carbazolyl)-1,1'-biphenyl), PVK(poly(N-vinylcarbazole), ADN(9,10-di(naphthalene-2-yl)anthracene), TCTA (4,4',4"-Tris(carbazol-9-yl)-triphylamine), TPBi(1,3,5-tris (N-phenylbenzimidazole-2-y)benzene), TBADN(2-tert-butyl-9,10-di(naphth-2-yl)anthracene), DSA (distyrylarylene), CDBP(4,4'-bis(9-carbazolyl)-2,2'-dimethyl-biphenyl), MADN(2-Methyl-9,10-bis(naphthalen-2-yl)anthracene), CPI(Hexaphenyl cyclotriphosphazene), UGH2 (1,4-Bis(triphenylsilyl)benzene), $DPSiO_3$ (Hexaphenylcyclotrisiloxane), $DIPSiO_4$ (Octaphenylcyclotetrasiloxane), PPF(2,8-Bis(diphenylphosphoryl)dibenzofuran), etc.

According to an embodiment, the light emitting layer EML may include styryl derivatives, for example, 1,4-bis [2-(3-N-ethylcarbazoryl)vinyl]benzene(BCzVB), 4-(di-p-tolylamino)-4'-[(di-p-tolylamino)styryl]stilbene(DPAVB), N-(4-((E)-2-(6-((E)-4-(diphenylamin)styryl)naphthalen-2-yl)vinyl)phenyl)-N-phenylbenzenamine(N-BDAVBi), etc., perylene and its derivatives, e.g., 2,5,8,1 1-Tetra-t-butylperylene(TBP), pyrene and its derivatives, e.g., 1,1-dipyrene, 1,4-dipyrenylbenzene, 1,4-Bis(N,N-Diphenylamino)pyrene as the dopant material.

The light emitting layer EML may include a metal complex including, for example, iridium (Ir), platinum (Pt), osmium (Os), gold (Au), titanium (Ti), zirconium (Zr), hafnium (Hf), europium (Eu), terbium (Tb) or thulium (Tm) as the phosphorescent dopant material. For example, FIrpic (iridium(III) bis(4,6-difluorophenylpyridinato-N,C2')picolinate), Fir6(Bis(2,4-difluorophenylpyridinato)-tetrakis(1-pyrazolyl)borate iridium(III)), or PtOEP(platinum octaethyl porphyrin) may be used as the phosphorescent dopant material, however, embodiments are not necessarily limited thereto or thereby.

The light emitting material may be changed depending on the light emitting layers EML-R, EML-G, and EML-B of the light emitting elements ED-R, ED-G, and ED-B shown in FIG. 5. As an example, the dopant material may be changed depending on the light emitting layers EML-R, EML-G, and EMIL-B.

Referring to FIG. 7B, the light receiving element OPD may include the light receiving layer OPL disposed on the hole transport region HTR. The light receiving layer OPL may include a light receiving material that receives a light and converts the received light to an electrical signal.

The light receiving layer OPL may include an organic light receiving material. In addition, according to an embodiment, the light receiving layer OPL may include a donor compound and an acceptor compound. As an example, according to an embodiment, the light receiving layer OPL may include a fullerene derivative, a PTCDI (perylene tetracarboxylic diimide) derivative, or a PTCDA (perylene tetracarboxylic dianhydride) derivative as the acceptor compound.

According to an embodiment, the light receiving layer OPL may include a phthalocyanine-based compound, a perylene-based compound, or a squaraine dye compound as the donor compound. As an example, according to an embodiment, the light receiving layer OPL may include SubPc(Subphthalocyanine), ZnPc(Zinc phthalocyanine), DTDCTB(Ditolyaminothienyl-benzothiadiazole-dicyanovinylene), PbPc(lead phthalocyanine), DBP(5,10,15,20-Tetraphenyl bisbenz[5,6]indeno[1,2,3-cd:1',2',3'-lm]perylene), or CuPc(copper phthalocyanine) as the donor compound.

In addition, according to an embodiment, the light receiving layer OPL of the light receiving element OPD may include an organic polymer material as the light receiving material. As an example, the light receiving layer OPL may include a conjugated polymer. The light receiving layer OPL may include a thiophene-based conjugated polymer, a benzodithiophene-based conjugated polymer, a thieno[3,4-c]pyrrole-4,6-dione(TPD)-based conjugated polymer, a diketo-pyrrole-pyrrole(DPP)-based conjugated polymer, a benzothia Diazole(BT)-based conjugated polymer, etc., however, the present invention is not necessarily limited thereto or thereby.

According to an embodiment, the electron transport region ETR of the light emitting element ED-D and the light receiving element OPD may have a single-layer structure of a single material, a single-layer structure of plural different materials, or a multi-layer structure of layers formed of plural different materials.

Referring to FIGS. 7A and 7B, the electron transport region ETR may include the electron transport layer ETL and the electron injection layer EIL, however, the present invention is not necessarily limited thereto or thereby. According to an embodiment, the electron transport region ETR may have a single-layer structure. In addition, the electron transport region ETR may further include a hole block layer.

The electron transport region ETR of the light emitting element ED-D may be disposed on the light emitting layer EML, and the electron transport region ETR of the light receiving element OPD may be disposed on the electron extraction layer EEBL.

According to an embodiment, the electron transport layer ETL may include an anthracene-based compound, however, the present invention is not necessarily limited thereto or thereby. The electron transport layer ETL may include, for example, $Alq_3$(Tris(8-hydroxyquinolinato)aluminum), 1,3,5-tri[(3-pyridyl)-phen-3-yl]benzene, 2,4,6-tris(3'-pyridin-3-yl)biphenyl-3-yl)-1,3,5-triazine, 2-(4-(N-phenylbenzoimidazol-1-yl)phenyl)-9,10-dinaphthylanthracene, TPBi(1,3,5-Tri(1-phenyl-1H-benzo[d]imidazol-2-yl)benzene), BCP(2,9-Dimethyl-4,7-diphenyl-1,10-phenanthroline), Bphen(4,7-Diphenyl-1,10-phenanthroline), TAZ(3-(4-Biphenyyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminium), $Bebq_2$(berylliumbis(benzoquinolin-10-olate)), ADN (9,10-di(naphthalene-2-yl) anthracene), BmPyPhB(1,3-Bis[3,5-di(pyridin-3-yl)phenyl] benzene) and a mixture thereof.

According to an embodiment, the electron transport layer ETL and the electron extraction layer EEBL of the light receiving element OPD may include different materials from each other. As an example, a material for the electron transport layer ETL of the light receiving element OPD and a material for the electron extraction layer EEBL of the light receiving element OPD may be different from each other.

For example, the electron transport layer ETL might not include the n-dopant material included in the electron extraction layer EEBL.

According to an embodiment, the electron injection layer EIL may include a metal halide, such as LiF, NaCl, CsF, RbCl, RbI, CuI, KI, etc., a lanthanum group metal, such as Yb, or a co-deposition material of the metal halide and the lanthanum group metal. For example, the electron injection layer EIL may include KI:Yb or RbI:Yb as the co-deposition material. The electron injection layer EIL may include a metal oxide, such as $Li_2O$ or BaO, or LiQ, however, the embodiment is not necessarily limited thereto or thereby. The electron injection layer EIL may include a mixture of an electron transport material and an insulating organo-metallic salt. The organo-metallic salt may be a material with an energy band gap of about 4 eV or more. For example, the organo-metallic salt may include, for example, metal acetate, metal benzoate, metal acetoacetate, metal acetylacetonate, or metal stearate.

According to an embodiment, the electron extraction layer EEBL may a layer including the n-dopant material or a layer including the n-dopant material and the acceptor compound of the light receiving layer OPL. As an example, the electron extraction layer EEBL may be a single material layer of a single material including one selected from among n-dopant materials or a composite material layer including an acceptor material and the n-dopant material.

The light receiving element OPD may further include an acceptor layer disposed between the light receiving layer OPL and the electron extraction layer EEBL and including an acceptor material.

Figure 8A:
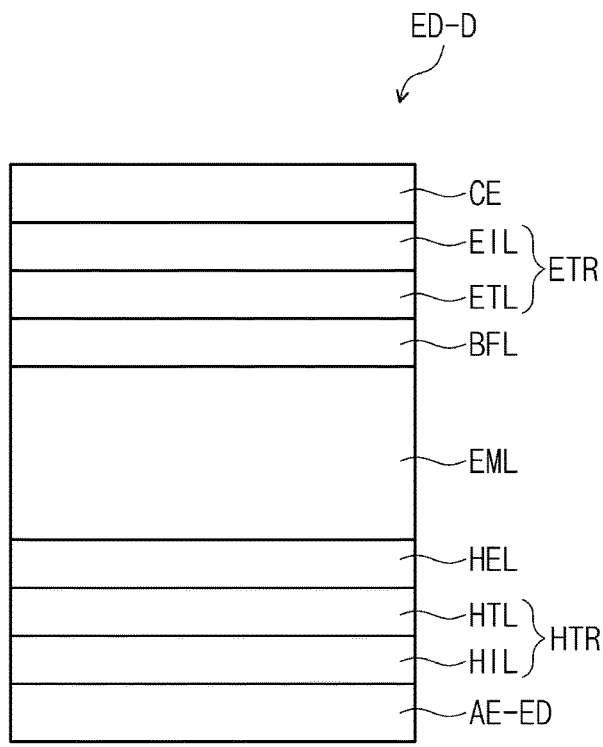
FIG. 8A is a cross-sectional view showing a light emitting element according to an embodiment of the present disclosure.
Figure 8B:
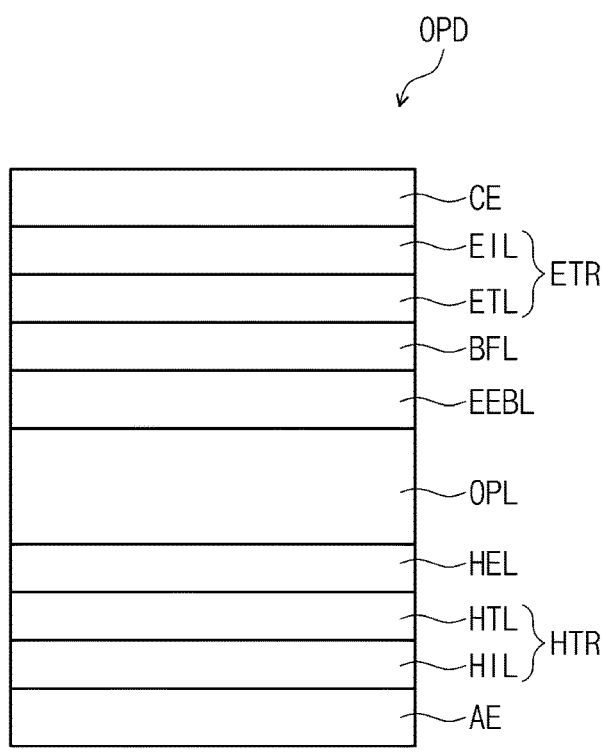
FIG. 8B is a cross-sectional view showing a light receiving element according to an embodiment of the present disclosure.

FIGS. 8A and 8B are cross-sectional views respectively showing a light emitting element ED-D and a light receiving element OPD. FIG. 8A is a cross-sectional view showing the light emitting element ED-D according to an embodiment of the present disclosure, and FIG. 8B is a cross-sectional view showing the light receiving element OPD according to an embodiment of the present disclosure. The light emitting element ED-D shown in FIG. 8A may further include an auxiliary layer HEL and a buffer layer BFL compared with the light emitting element shown in FIG. 7A. In addition, the light receiving element OPD shown in FIG. 8B may further include an auxiliary layer HEL and a buffer layer BFL compared with the light receiving element shown in FIG. 7B. The light emitting element ED-D shown in FIG. 8A and the light receiving element OPD shown in FIG. 8B may correspond to embodiments of the light emitting elements ED-R, ED-G, and ED-B and the light receiving element OPD of the display element layer EDL of the display module DM shown in FIG. 5.

Referring to FIG. 8A, the light emitting element ED-D may have a structure in which a first electrode AE-ED, a hole transport region HTR, the auxiliary layer HEL, a light emitting layer EML, the buffer layer BFL, an electron transport region ETR, and a second electrode CE are stacked. Referring to FIG. 8B, the light receiving element OPD may have a structure in which a first electrode AE, a hole transport region HTR, the auxiliary layer HEL, a light receiving layer OPL, an electron extraction layer EEBL, the buffer layer BFL, an electron transport region ETR, and a second electrode CE are stacked.

The auxiliary layer HEL may include material used for the hole transport region HTR. As an example, the auxiliary layer HEL may include carbazole-based derivatives, such as N-phenylcarbazole and polyvinylcarbazole, fluorene-based derivatives, triphenylamine-based derivatives, such as TPD (N,N'-bis(3-methylphenyl)-N,N'-diphenyl-[1,1-biphenyl]-4, 4'-diamine) and TCTA(4,4',4"-tris(N-carbazolyl)triphenylamine), NPB(N,N'-di(napthhalene-1-yl)-N,N'-diplienyl-benzidine), TAPC(4,4'-Cyclohexylidene bis[N,N-bis(4-methylphenyl)benzenanime]), HMTPD(4,4'-Bis[N,N'-(3-tolyl)amino]-3,3'-dimethylbiphenyl), CzSi(9-(4-tert-Butylphenyl)-3,6-bis(triphenylsilyl)-9H-carbazole), CCP(9-phenyl-9H-3,9'-bicarbazole), mCP(1,3-Bis(N-carbazolyl)benzene), or mDCP(1,3-bis(1,8-dimethyl-9H-carbazol-9-yl)benzene).

In addition, the auxiliary layer HEL may include a p-dopant material. The auxiliary layer HEL may include a metal having a work function equal to or greater than about 5 eV or an organic compound having a Lowest Unoccupied Molecular Orbital (LUMO) level equal to or smaller than about −5 eV.

The auxiliary layer HEL of the light emitting element ED-D may be used as a light emitting auxiliary layer. As an example, the auxiliary layer HEL of the light emitting element ED-D may compensate for a resonance distance according to a wavelength of a light emitted from the light emitting layer EML to increase the light emission efficiency. According to an embodiment, the auxiliary layer HEL may be provided to have a thickness varying according to the wavelength of the light emitted from the light emitting layers EML-R, EML-G, and EML-B of the light emitting elements ED-R, ED-G, and ED-B shown in FIG. 5.

The auxiliary layer HEL of the light receiving element OPD may allow holes formed in the light receiving layer OPL to move more easily. As an example, the auxiliary layer HEL may include the p-dopant material and thus may allow the holes formed in the light receiving layer OPL to more easily move to the first electrode AE.

In the light emitting element ED-D and the light receiving element OPD respectively shown in FIGS. 8A and 8B, the buffer layer BFL may include, for example, at least one of BCP(2,9-dimethyl-4,7-diphenyl-1,10-phenanthroline) and Bphen(4,7-diphenyl-1,10-phenanthroline), however, the present invention is not necessarily limited thereto or thereby. According to an embodiment, the buffer layer BFL of the light receiving element OPD might not include the n-dopant material included in the electron extraction layer EEBL.

Referring to FIG. 5 again, the light emitting layers EML-R EML-G, and EML-B of the light emitting elements ED-R, ED-G, and ED-B may be formed in the first opening OP-E to be separated from each other. In addition, the light receiving layer OPL and the electron extraction layer EEBL of the light receiving element OPD may be formed in the second opening OP-I to be separated from each other.

In the embodiment shown in FIG. 5, the hole transport region HTR may be disposed under the light emitting layers EML-R, EML-G, and EML-B of the light emitting elements ED-R, ED-G, and ED-B or under the light receiving layer OPL of the light receiving element OPD and may be distinguished from each other by the pixel definition layer PDL. In addition, according to an embodiment, the electron transport region ETR may be provided as a single common layer. The electron transport region ETR may be provided as the common layer over the light emitting elements ED-R, ED-G, and ED-B and the light receiving element OPD. The electron transport region ETR may overlap the pixel definition layer PDL, the light emitting layers EML-R, EML-G, and EML-B, and the light receiving layer OPL.

According to an embodiment, the display module may include the encapsulation layer TFL disposed on the light emitting elements ED-R, ED-G, and ED-B and the light receiving element OPD. The encapsulation layer TFL may include at least one inorganic layer and at least one organic layer. As an example, the encapsulation layer TFL may include an inorganic layer, an organic layer, and an inorganic layer, which are sequentially stacked, however, the layers forming the encapsulation layer TFL are not necessarily limited thereto or thereby.

According to an embodiment, the display module DM may include the input sensing layer ISL disposed on the display panel DP. The input sensing layer ISL may be disposed on the display element layer EDL. The input sensing layer ISL may sense an external input applied thereto. For example, the external input may be a user input. The user input may include a variety of external inputs, such as a part of user's body, light, heat, pen, or pressure.

The input sensing layer ISL may be formed on the display panel DP through successive processes. In this case, it may be expressed that the input sensing layer ISL is disposed directly on the display panel DP. The expression "the input sensing layer ISL is disposed directly on the display panel DP" means that no intervening elements are present between the input sensing layer ISL and the display panel DP. For example, a separate adhesive member might not be disposed between the input sensing layer ISL and the display panel DP. As an example, the input sensing layer ISL may be disposed directly on the encapsulation layer TFL.

The present disclosure is not necessarily limited thereto or thereby, and an adhesive member may further be disposed between the input sensing layer ISL and the display panel DP. The input sensing layer ISL may include a lower insulating layer IS-IL1, a first conductive layer IS-CL1, an interlayer insulating layer IS-IL2, a second conductive layer IS-CL2, and an upper insulating layer IS-IL3. According to an embodiment, at least one of the lower insulting layer IS-IL1 and the upper insulating layer IS-IL3 may be omitted.

Each of the first conductive layer IS-CL1 and the second conductive layer IS-CL2 may have a single-layer structure or a multi-layer structure of layers stacked in the third directional axis DR3. A conductive layer having the multi-layer structure may include two or more of transparent conductive layers and metal layers. The conductive layer of the multi-layer structure may include metal layers including different metals from each other. The transparent conductive layer may include indium tin oxide (ITO), indium zinc oxide (IZO), zinc oxide (ZnO), indium tin zinc oxide (ITZO), PEDOT, a metal nanowire, a graphene, or the like. The metal layer may include molybdenum, silver, titanium, copper, aluminum, and alloys thereof. For instance, each of the first conductive layer IS-CL1 and the second conductive layer IS-CL2 may have a three-metal-layer structure, i.e., a three-laver structure of titanium/aluminum/titanium. A metal with a relatively high durability and a low reflectance may be applied as upper and lower layers, and a metal with a high electrical conductivity may be applied as an inner layer.

Each of the first conductive layer IS-CL1 and the second conductive layer IS-CL2 may include a plurality of conductive patterns. Hereinafter, the first conductive layer IS-CL1 will be described as including first conductive patterns, and the second conductive layer IS-CL2 will be described as including second conductive patterns. Each of the first conductive patterns and the second conductive patterns may include sensing electrodes and signal lines connected to the sensing electrodes. The first conductive patterns and the second conductive patterns may overlap a light blocking portion BM described later. The light blocking portion BM may overlap the first conductive layer IS-CL1 and the second conductive layer IS-CL2 and thus may prevent the external light from being reflected by the first conductive layer IS-CL1 and the second conductive layer IS-CL2.

Each of the lower insulating layer IS-IL1, the interlayer insulating layer IS-IL2, and the upper insulating layer IS-IL3 may include an inorganic layer or an organic layer. In the present embodiment, each of the lower insulating layer IS-IL1 and the interlayer insulating layer may be the inorganic layer. In addition, the upper insulating layer IS-IL3 may include the organic layer.

According to an embodiment, the display module DM may include the anti-reflective member RP disposed on the display panel DP. According to an embodiment, the anti-reflective member RP may be disposed directly on the input sensing layer ISL. The anti-reflective member RP may include the color filter layer CFL and the organic planarization layer OCL.

The color filter layer CFL may include filters CF and the light blocking portion BM. The filters CF may include a red color filter CF-R, a green color filter CF-G, and a blue color filter CF-B. The red color filter CF-R, the green color filter CF-G, and the blue color filter CF-B may respectively correspond to the red light emitting area PXA-R, the green light emitting area PXA-G, and the blue light emitting area PXA-B. In addition, the green color filter CF-G may overlap the light receiving area IPA. For example, according to an embodiment, the green color filter CF-G may overlap the green light emitting element ED-G and the light receiving element OPD.

The red color filter CF-R may transmit the red light, the green color filter CF-G may transmit the green light, and the blue color filter CF-B may transmit the blue light. Each of the red color filter CF-R, the green color filter CF-G, and the blue color filter CF-B may include a polymer photoresist and a pigment or dye. The red color filter CF-R may include a red pigment or dye, the green color filter CF-G may include a green pigment or dye, and the blue color filter CF-B may include a blue pigment or dye.

The present invention is not necessarily limited thereto or thereby, and the blue color filter CF-B might not include the pigment or dye. The blue color filter CF-B may include the polymer photoresist and might not include the pigment or dye. The blue color filter CF-B may be transparent. The blue color filter CF-B may include a transparent photoresist.

The light blocking portion BM may be disposed on the input sensing layer ISL and may overlap a boundary between the filters CF adjacent to each other. Edges of the filters CF adjacent to each other may overlap each other. As an example, the green color filter CF-G and the red color fitter CF-R may be disposed on the light blocking portion BM to overlap each other, or the green color filter CF-G and the blue color filter CF-B may be disposed on the light blocking portion BM to overlap each other. The light blocking portion BM may prevent a light leakage phenomenon from occurring and may define a boundary between the color filters CF-R, CF-G, and CF-B adjacent to each other.

The light blocking portion BM may be a black matrix. The light blocking portion BM may include an organic pigment or dye. The light blocking portion BM may include an organic light blocking material or an inorganic light blocking material, which includes a black pigment or a black dye. In addition, the light blocking portion BM may overlap the pixel definition layer PDL. The light blocking portion BM may overlap the pixel definition layer PDL that defines the boundary between the light emitting areas PXA-R, PXA-G, and PXA-B and separates the light emitting areas PXA-R, PXA-G, and PXA-B from the light receiving area IPA.

The organic planarization layer OCL may be disposed on the color filter layer CFL. The organic planarization layer OCL may be disposed on the color filter layer CFL to protect the color filters CF-R CF-G, and CF-B and may planarize an upper surface of the color filter layer CFL. The organic planarization layer OCL may include an organic material, such as ate acrylic resin or an epoxy resin.

According to an embodiment, the display element layer of the electronic device may include the light emitting element and the light receiving element and may include the electron extraction layer that is disposed on the light receiving layer of the light receiving element and does not overlap the light emitting layer of the light emitting element, and thus, the efficiency of the light receiving element may be increased. For example, the electron extraction layer of the electronic device may include the n-dopant material including the metal having the work function equal to or smaller than about 3.0 eV or the organic compound having the HOMO level equal to or greater than about −3.0 eV and thus may allow the electron extraction to more easily occur in the light receiving layer. Accordingly, the light receiving element of the electronic device may include the electron extraction layer distinguished from the electron transport layer of the electron transport region, and thus, the efficiency of the light receiving element may be increased.

Figure 9:
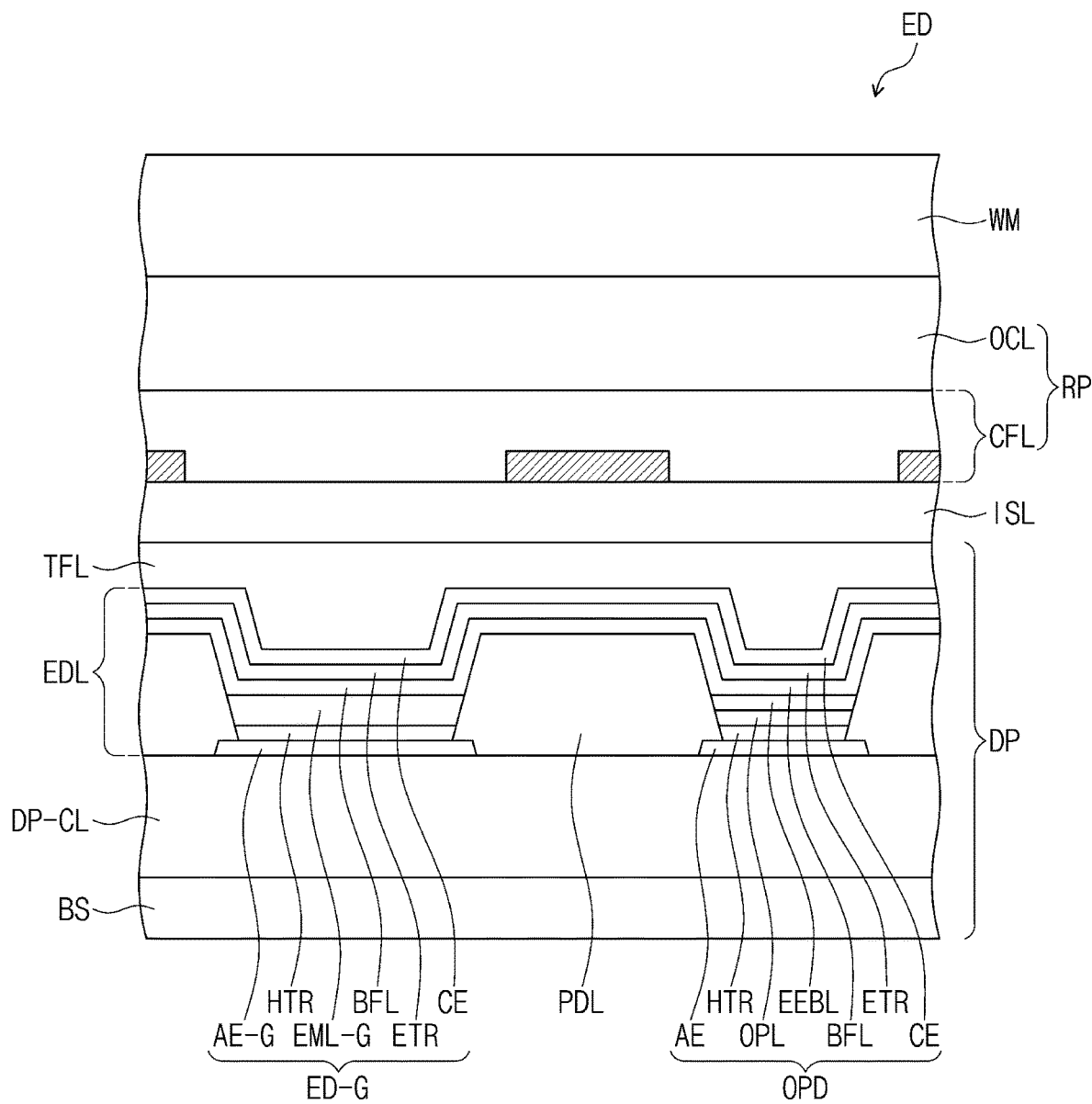
FIG. 9 is a cross-sectional view showing an electronic device according to an embodiment of the present disclosure.
Figure 10:
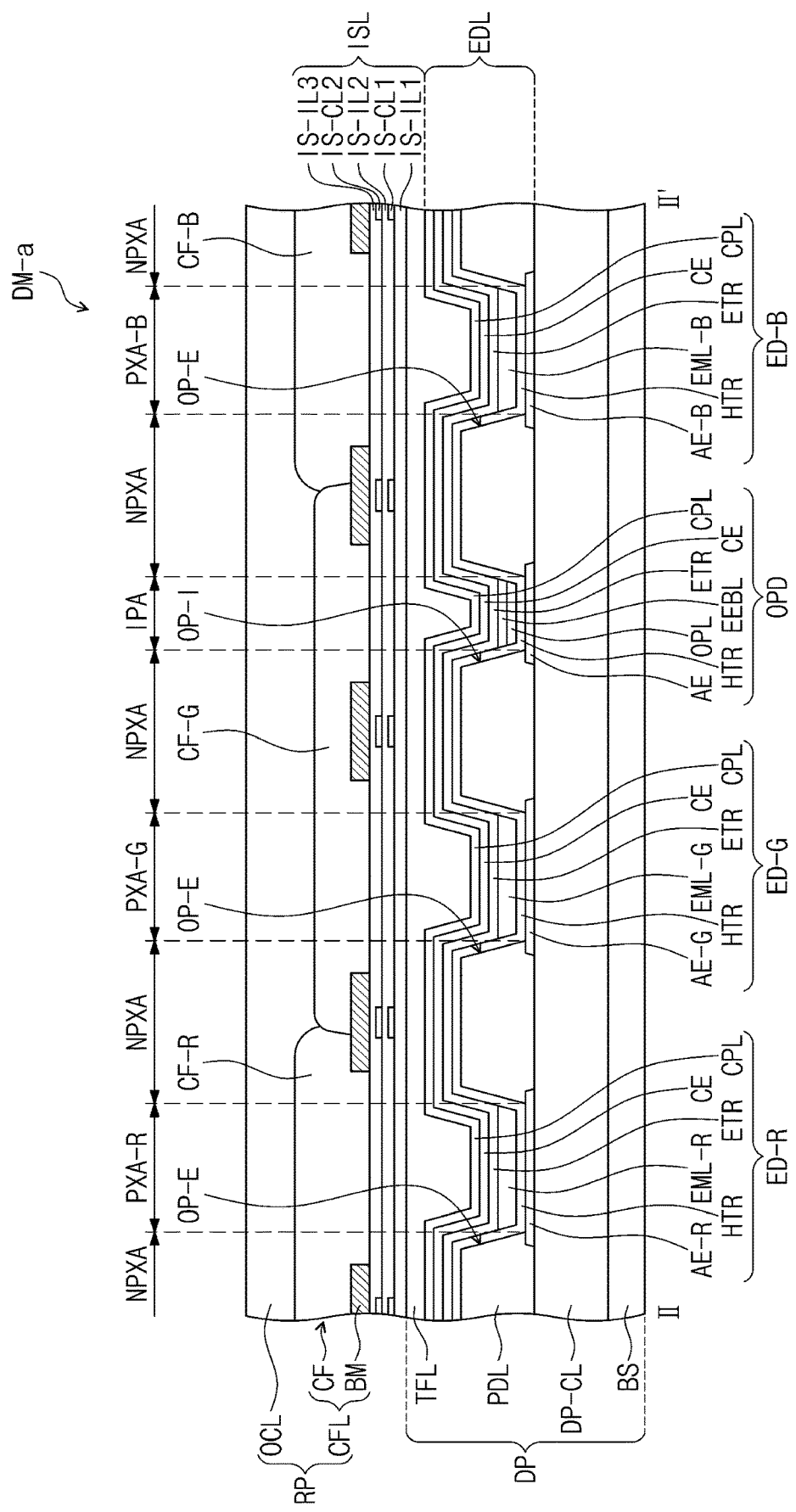
FIG. 10 is a cross-sectional view showing a portion of a display module according to an embodiment of the present disclosure.

FIG. 9 is a cross-sectional view showing an electronic device ED according to an embodiment of the present disclosure, and FIG. 10 is a cross-sectional view showing a portion of a display module DM-a according to an embodiment of the present disclosure. In FIGS. 9 and 10, the same reference numerals may denote the same elements in FIGS. 1 to 8B, and to the extent that a detailed description of an element is omitted, it may be assumed that the element is at least similar to a corresponding element that has been described elsewhere in the instant specification.

The electronic device ED shown in FIG. 9 is different from that shown in FIG. 6 in that a light emitting element ED-G and a light receiving element OPD further include a buffer layer BFL. Referring to FIG. 9, the buffer layer BFL may be disposed on a light emitting layer EML-G and an electron extraction layer EEBL.

The buffer layer BFL may be provided as a common layer. For example, the buffer layer BFL may be provided over the light emitting element ED-G and the light receiving element OPD as the common layer. The buffer layer BFL may entirely overlap a pixel definition layer PDL, the light emitting layer EML-G, and a light receiving layer OPL.

According to an embodiment, the electron extraction layer EEBL included in the light receiving element OPD may include an n-dopant material. In addition, the buffer layer BFL might not include the n-dopant material included in the electron extraction layer EEBL.

FIG. 10 is a cross-sectional view showing the display module DM-a. The display module DM-a shown in FIG. 10 has a difference in configuration of light emitting elements ED-R, ED-G, and ED-B and a light receiving element OPD when compared with the display module DM shown in FIG. 5.

Referring to FIG. 10, different from the hole transport region HTR shown in FIG. 5, a hole transport region HTR is entirely formed on the light emitting elements ED-R, ED-G, and ED-B and the light receiving element OPD as a common layer. The hole transport region HTR might not have a shape corresponding to that of the light emitting areas PXA-R, PXA-G, and PXA-B and a light receiving area IPA and ma be provided as the common layer to entirely overlap a pixel definition layer PDL, light emitting layers EML-R, EML-G, and EML-B, and a light receiving layer OPL.

In addition, a display element layer EDL shown in FIG. 10 may further include a capping layer CPL. The capping layer CPL may be disposed on a second electrode CE of the light emitting elements ED-R, ED-G, and ED-B and the light receiving element OPD. The capping layer CPL may be disposed between the second electrode CE and an encapsulation layer TFL. The capping layer CPL may be provided as a common layer to entirely overlap the pixel definition layer PDL, the light emitting layers EML-R, EML-G, and EML-B, and the light receiving layer OPL.

The capping, layer CPL may include a single layer or a multi-layer. According to an embodiment, the capping layer CPL may be an organic layer or an inorganic layer. As an example, in a case where the capping layer CPL includes an inorganic material, the inorganic material may include SiON, SiNx, SiOy, an alkali metal compound, such as LiF, an alkaline earth metal compound, such as MgF2, or the like.

As an example, in a case where the capping layer CPL includes an organic material, the organic material may include α-NPD, NPB, TPD, m-MTDATA, Alq$_3$, CuPc, TPD15(N4,N4,N4',-tetra (biphenyl-4-yl) biphenyl-4,4'-diamine), TCTA(4,4',4"-Tris (carbazol-9-yl)triphenylamine), or the like or may include an epoxy resin or an acrylate, such as methacrylate, however, it is not necessarily limited thereto or thereby.

As shown in FIGS. 9 and 10, the light receiving element may include the electron extraction layer disposed on the light receiving layer and including the n-dopant material and thus may have the excellent efficiency.

Hereinafter, the light receiving element according to the present disclosure will be described in detail with reference to embodiment examples and comparative examples. In addition, the embodiment examples shown below are to help understanding of the present disclosure, and the scope of the present disclosure is not necessarily limited thereto or thereby.

According to an example embodiment, the light receiving element may be manufactured in a particular manner. For example, the hole injection layer may be formed by cleaning a glass substrate on which ITO is patterned and depositing tungsten oxide (WO$_3$) with a thickness of about 50 Å. Then, the hole transport layer may be formed by depositing NPB with a thickness of about 300 Å.

The light receiving layer including the donor compound and the acceptor compound may be formed on the hole transport layer. In embodiment example 1 to embodiment example 8, the electron extraction layer may be formed on the light receiving layer.

In embodiment example 1 to embodiment example 8, the buffer layer and the electron transport layer may be sequentially formed on the electron extraction layer, and the buffer layer and the electron transport layer may be sequentially formed on the light receiving layer in comparative example 1-1 to comparative example 1-4. ha comparative example 2-1 to comparative example 2-4, the acceptor layer, the buffer layer, and the electron transport layer may be sequentially formed on the light receiving layer. The buffer layer may be formed by depositing TSPO1 with a thickness of about 50 Å, and the electron transport layer having a thickness of about 300 Å may be formed on the buffer layer by doping the TSPO1 with Rb$_2$CO$_3$ of about 10%. Then, the electron injection layer may be formed by depositing LiF with a thickness of about 10 Å. After that, the second electrode may be formed by providing A1 with a thickness of about 1000 Å. The donor compound, the acceptor compound, and the n-dopant material that may be used in the embodiment examples and the comparative examples are shown in Table 1 below.

TABLE 1

|  | Name | Name of compound |
|---|---|---|
| Donor compound | D-1 | SubPc(Subphthaloeyanine) |
|  | D-2 | ZnPc(Zinc phthalocyanine) |
|  | D-3 | DTDCTB(Ditolyaminothienyl-benzothiadiazole-dicyanovinylene) |
| Acceptor compound | A-1 | Fullerene C70 |
|  | A-2 | Fullerene C60 |
| n-dopant | n-1 | Yb |
|  | n-2 | LiQ |
|  | n-2 | KI |

Table 2 shows results of evaluation of the light receiving element of embodiment example 1 to embodiment example 8, comparative example 1-1 to comparative example 1-4, and comparative example 2-1 to comparative example 24. Table 2 shows combinations of the donor compound, the acceptor compound, and the n-dopant material used in the manufactured light receiving element. The donor compound and the acceptor compound in Table 2 may be used for the light receiving layer, and the n-dopant material in Table 2 may be used for the electron extraction layer. In addition, the acceptor layer in comparative example 2-1 to comparative example 2-4 may be formed by using the acceptor compound suggested in Table 1.

Table 2 shows results of evaluating the efficiency of the light receiving element manufactured by the combination of values of the work function of n-dopant material and the suggested materials. The work function may be measured by an ultraviolet photoelectron spectroscopy (UPS). The efficiency of the light receiving element may be shown as a conversion efficiency when a voltage of −3 eV is provided. In Table 2, the efficiency (EQE$_{max}$) of the light receiving element is a photoelectric conversion efficiency and shows a relative efficiency with respect to a case where the entire light is converted into the electrical signal set as 100%.

TABLE 2

|  | Donor compound | Acceptor compound | n-dopant | Work function (eV) | EQE$_{max}$ (%) |
|---|---|---|---|---|---|
| Embodiment example 1 | D-1 | A-1 | n-1 | 2.6 | 79 |
| Embodiment example 2 | D-1 | A-1 | n-2 | 2.9 | 75 |
| Embodiment example 3 | D-1 | A-1 | n-3 | 2.3 | 80 |
| Embodiment example 4 | D-2 | A-1 | n-1 | 2.6 | 65 |
| Embodiment example 5 | D-2 | A-2 | n-1 | 2.6 | 64 |
| Embodiment example 6 | D-3 | A-1 | n-2 | 2.9 | 72 |
| Embodiment example 7 | D-3 | A-2 | n-2 | 2.9 | 69 |
| Embodiment example 8 | D-3 | A-2 | n-1 | 2.6 | 66 |
| Comparative example 1-1 | D-1 | A-1 | — | — | 40 |
| Comparative example 1-2 | D-2 | A-1 | — | — | 31 |
| Comparative example 1-3 | D-1 | A-2 | — | — | 38 |
| Comparative example 1-4 | D-3 | A-2 | — | — | 25 |
| Comparative | D-1 | A-1 | — | — | 38 |

TABLE 2-continued

| | Donor compound | Acceptor compound | n-dopant | Work function (eV) | EQE$_{max}$ (%) |
|---|---|---|---|---|---|
| example 2-1 | | | | | |
| Comparative example 2-2 | D-2 | A-1 | — | — | 30 |
| Comparative example 2-3 | D-1 | A-2 | — | — | 39 |
| Comparative example 2-4 | D-3 | A-2 | — | — | 29 |

Referring to the results in Table 2, when compared with comparative examples where the electron extraction layer is not included, embodiment examples where the electron extraction layer containing the n-dopant material is disposed on the light receiving layer of the light receiving element exhibits excellent efficiency. The electronic device includes the display element layer including the light emitting element and the light receiving element and includes the electron extraction layer disposed on the light receiving layer of the light receiving element and including the n-dopant material to allow the electrons to be more easily extracted in the light receiving element, and thus, the light receiving element may be More sensitive. In addition, the electronic device includes the light receiving element including the electron extraction layer distinguished from the electron transport layer and including the n-dopant material, and thus, light receiving element may be more efficient.

Although embodiments of the present disclosure have been described herein, it is understood that the present disclosure is not necessarily limited to these embodiments but various changes and modifications can be made by one ordinary skilled in the art within the spirit and scope of the present disclosure.

What is claimed is:

1. An electronic device, comprising:
a base layer; and
a display element layer disposed on the base layer and comprising a pixel definition layer including an opening therethrough, a light emitting element, and a light receiving element distinguished from the light emitting element by the pixel definition layer, each of the light emitting element and the light receiving element comprising:
a first electrode;
a hole transport region disposed on the first electrode;
an electron transport region disposed on the hole transport region; and
a second electrode disposed on the electron transport region,
wherein the light emitting element comprises a light emitting layer disposed between the hole transport region and the electron transport region, and
wherein the light receiving element comprises:
a light receiving layer disposed between the hole transport region and the electron transport region, the light receiving layer configured to convert a light incident thereto into an electrical signal;
an electron extraction layer disposed between the light receiving layer and the electron transport region, the electron extraction layer comprising an n-dopant material,
wherein the n-dopant material comprises a metal having a work function equal to or smaller than about 3.0 eV, or an organic compound having a highest energy occupied molecular orbital (HOMO) level equal to or greater than about −3.0 eV.

2. The electronic device of claim 1, wherein the n-dopant material comprises Ca, Yb, K, Cs, Rb, and/or Li.

3. The electronic device of claim 1, wherein the electron extraction layer is not disposed within the light emitting element.

4. The electronic device of claim 1, wherein the electron transport region comprises:
an electron transport layer; and
an electron injection layer disposed between the electron transport layer and the second electrode,
wherein the n-dopant material is not present within the electron transport layer.

5. The electronic device of claim 1, wherein the light receiving layer comprises a donor compound and an acceptor compound, and the acceptor compound comprises a fullerene derivative or a perylene tetracarboxylic diimide (PTCDI) derivative.

6. The electronic device of claim 5, wherein the electron extraction layer comprises the n-dopant material and the acceptor compound.

7. The electronic device of claim 5, wherein the electron extraction layer is a layer of a single material comprising the n-dopant material or a layer of a composite material comprising the n-dopant material and the acceptor compound.

8. The electronic device of claim 5, wherein the donor compound comprises a phthalocyanine-based compound or a perylene-based compound.

9. The electronic device of claim 1, wherein the display element layer further comprises a buffer layer disposed between the light emitting layer and the electron transport region and between the electron extraction layer and the electron transport region.

10. The electronic device of claim 9, wherein the n-dopant material is not present within the buffer layer.

11. The electronic device of claim 1, wherein the hole transport region disposed under the light receiving layer comprises a same material as the hole transport region disposed under the light emitting layer.

12. The electronic device of claim 1, wherein the electron transport region disposed on the light receiving layer comprises a same material as the electron transport region disposed on the light emitting layer.

13. An electronic device, comprising:
a display module comprising a red-light emitting area, a green-light emitting area, a blue-light emitting area, and a light receiving area, which are spaced apart from each other, the display module further comprising:
a base layer;
a display element layer disposed on the base layer and comprising a light emitting element and a light receiving element; and
an input sensing layer disposed on the display element layer,
wherein the display element layer further comprises:
a first electrode;
a hole transport region disposed on the first electrode;
an electron transport region disposed on the hole transport region; and
a second electrode disposed on the electron transport region,
wherein the light emitting element comprises a light emitting layer disposed between the hole transport region and the electron transport region, wherein the light receiving element comprises a light receiving layer disposed between the hole transport region and the electron transport region and an electron extraction layer disposed on the light receiving layer, and wherein the electron extraction layer and light emitting layer do not overlap one another.

14. The electronic device of claim 13, wherein the electron extraction layer comprises an n-dopant material.

15. The electronic device of claim 14, wherein the electron extraction layer comprises a metal having a work function equal to or smaller than about 3.0 eV, a metal compound comprising a metal having a work function equal to or smaller than 3.0 eV, an organic compound having a highest energy occupied molecular orbital (HOMO) level equal to or greater than about −3.0 eV, or a composite compound comprising an organic material having a HOMO level equal to or greater than about −3.0 eV.

16. The electronic device of claim 14, wherein the electron transport region comprises:
an electron transport layer; and
an electron injection layer disposed between the electron transport layer and the second electrode,
wherein the n-dopant material is not present within the electron transport layer.

17. The electronic device of claim 14, wherein the light receiving layer comprises a donor compound and an acceptor compound, and the acceptor compound comprises a fullerene derivative or a perylene tetracarboxylic diimide (PTCDI) derivative.

18. The electronic device of claim 17, wherein the electron extraction layer comprises only the n-dopant material or comprises the n-dopant material and the acceptor compound.

19. The electronic device of claim 13, wherein the light emitting element comprises:
a red-light emitting element corresponding to the red-light emitting area;
a blue-light emitting element corresponding to the blue-light emitting area; and
a green-light emitting element corresponding to the green-light emitting area.

20. An electronic device, comprising:
a base layer;
a first electrode disposed on the base layer and comprising a light emitting electrode and a light receiving electrode spaced apart from the light emitting electrode;
a pixel definition layer disposed on the base layer and including with first and second openings through which the light emitting electrode and the light receiving electrode are exposed, respectively;
a light emitting layer disposed on the light emitting electrode within the first opening;
a light receiving layer disposed on the light receiving electrode within the second opening;
an electron extraction layer disposed on the light receiving layer within the second opening, the electron extraction layer comprises Ca, Yb, K, Cs, Rb, and/or Li;
a hole transport region disposed between the light emitting electrode and the light emitting layer and between the light receiving electrode and the light receiving layer;
an electron transport region entirely overlapping each of the pixel definition layer, the light emitting layer, and the light receiving layer;
a second electrode disposed on the electron transport region; and
an encapsulation layer disposed on the second electrode.

21. The electronic device of claim 20, wherein the electron extraction layer comprises an n-dopant material.

22. The electronic device of claim 21, wherein the n-dopant material comprises a metal having a work function equal to or smaller than about 3.0 eV or an organic compound having a highest energy occupied molecular orbital (HOMO) level equal to or greater than about −3.0 eV.

23. The electronic device of claim 21, wherein the electron transport region comprises:
an electron transport layer; and
an electron injection layer disposed on the electron transport layer,
wherein the n-dopant material is not present within the electron transport layer.

24. The electronic device of claim 21, further comprising a buffer layer disposed between the electron transport region and the light emitting layer and between the electron transport region and the electron extraction layer, wherein the n-dopant material is not present within the buffer layer.

25. The electronic device of claim 20, wherein the hole transport region entirely overlaps each of the pixel definition layer, the light emitting layer, and the light receiving layer.

* * * * *